US012080676B2

(12) United States Patent
Yu

(10) Patent No.: US 12,080,676 B2
(45) Date of Patent: Sep. 3, 2024

(54) SEMICONDUCTOR PACKAGE INCLUDING A MOLDING LAYER

(71) Applicant: SAMSUNG ELECTRONICS CO., LTD., Suwon-si (KR)

(72) Inventor: Hae-Jung Yu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 17/646,672

(22) Filed: Dec. 30, 2021

(65) Prior Publication Data
US 2022/0328445 A1 Oct. 13, 2022

(30) Foreign Application Priority Data
Apr. 9, 2021 (KR) .................. 10-2021-0046425

(51) Int. Cl.
H01L 23/31 (2006.01)
H01L 23/00 (2006.01)
H01L 23/48 (2006.01)
H01L 23/498 (2006.01)
H01L 25/065 (2023.01)

(52) U.S. Cl.
CPC .......... *H01L 24/73* (2013.01); *H01L 23/3157* (2013.01); *H01L 23/481* (2013.01); *H01L 23/49822* (2013.01); *H01L 24/06* (2013.01); *H01L 25/0652* (2013.01); *H01L 2224/06177* (2013.01); *H01L 2224/73204* (2013.01); *H01L 2225/06513* (2013.01); *H01L 2225/06517* (2013.01); *H01L 2225/06541* (2013.01); *H01L 2225/06589* (2013.01)

(58) Field of Classification Search
CPC ...................................................... H01L 24/73
See application file for complete search history.

(56) References Cited

U.S. PATENT DOCUMENTS

| 8,227,904 | B2 | 7/2012 | Braunisch et al. |
| 8,803,336 | B2 | 8/2014 | Lee et al. |
| 9,059,179 | B2 | 6/2015 | Karikalan et al. |
| 9,087,766 | B2 | 7/2015 | Chun et al. |
| 9,209,156 | B2 | 12/2015 | Len et al. |
| 9,252,030 | B1 | 2/2016 | Jin |
| 9,431,371 | B2 | 8/2016 | Karikalan et al. |
| 10,002,835 | B2 | 6/2018 | Fasano et al. |
| 2012/0256322 | A1 | 10/2012 | Itou et al. |

(Continued)

FOREIGN PATENT DOCUMENTS

| CN | 109727944 | 5/2019 |
| CN | 110676240 | 1/2020 |

(Continued)

*Primary Examiner* — William A Harriston
(74) *Attorney, Agent, or Firm* — F. Chau & Associates, LLC

(57) ABSTRACT

A semiconductor package includes a first semiconductor chip that has a mount region and an overhang region, a substrate disposed on a bottom surface at the mount region of the first semiconductor chip, and a molding layer disposed on the substrate. The molding layer includes a first molding pattern disposed on a bottom surface at the overhang region of the first semiconductor chip and covering a sidewall of the substrate, and a second molding pattern on the first molding pattern and covering a sidewall of the first semiconductor chip.

18 Claims, 20 Drawing Sheets

(56) References Cited

U.S. PATENT DOCUMENTS

| | | | |
|---|---|---|---|
| 2014/0091473 A1* | 4/2014 | Len | H01L 21/4853 |
| | | | 438/118 |
| 2015/0162301 A1 | 6/2015 | Huang et al. | |
| 2015/0380394 A1* | 12/2015 | Jang | H01L 24/92 |
| | | | 438/108 |
| 2019/0088620 A1 | 3/2019 | Lin et al. | |
| 2020/0013767 A1 | 1/2020 | Baik | |
| 2020/0027806 A1 | 1/2020 | Lin et al. | |
| 2020/0312755 A1 | 10/2020 | Choi | |

FOREIGN PATENT DOCUMENTS

| | | |
|---|---|---|
| KR | 101099578 | 12/2011 |
| KR | 101538539 | 7/2015 |
| KR | 20200113372 | 10/2020 |

\* cited by examiner

SEMICONDUCTOR PACKAGE INCLUDING A MOLDING LAYER

CROSS-REFERENCE TO RELATED APPLICATION

This U.S. nonprovisional application claims priority under 35 U.S.C § 119 to Korean Patent Application No. 10-2021-0046425 filed on Apr. 9, 2021 in the Korean Intellectual Property Office, the disclosure of which is hereby incorporated by reference in its entirety.

TECHNICAL FIELD

The present inventive concepts relate to a semiconductor package, and more particularly, to a semiconductor package including a molding layer.

DISCUSSION OF THE RELATED ART

Semiconductor integrated circuit chips are generally disposed within a semiconductor package so as to protect the integrated circuit chips and to help connect them to electronic products. Typically, a semiconductor package is configured such that a semiconductor chip is mounted on a printed circuit board (PCB) and bonding wires or bumps are used to electrically connect the semiconductor chip to the printed circuit board.

SUMMARY

A semiconductor package includes a first semiconductor chip that has a mount region and an overhang region; a substrate on a bottom surface at the mount region of the first semiconductor chip; and a molding layer on the substrate. The molding layer includes a first molding pattern disposed on a bottom surface at the overhang region of the first semiconductor chip and covering a sidewall of the substrate; and a second molding pattern disposed on the first molding pattern and covering a sidewall of the first semiconductor chip.

A semiconductor package includes an interposer substrate; a first semiconductor chip disposed on the interposer substrate; and a molding layer that covers a sidewall of the interposer substrate. The first semiconductor chip includes an overhang region and a mount region. The molding layer is disposed on a bottom surface at the overhang region of the first semiconductor chip. A bottom surface of the molding layer is coplanar with a bottom surface of the interposer substrate.

A semiconductor package includes an interposer substrate; a plurality of solder terminals disposed on a bottom surface of the interposer substrate; a chip stack disposed on a top surface of the interposer substrate, the chip stack including a first lower semiconductor chip and a plurality of first upper semiconductor chips disposed on the first lower semiconductor chip; a plurality of first bumps disposed between the interposer substrate and the first lower semiconductor chip; and a molding layer disposed on the interposer substrate. The first lower semiconductor chip includes a plurality of through electrodes therein. The interposer substrate includes a semiconductor die, a plurality of through vias, a plurality of wiring structures, and a plurality of interposer pads. The first lower semiconductor chip includes a mount region disposed on the interposer substrate; and an overhang region spaced apart from the interposer substrate. The molding layer includes a first molding pattern disposed on a bottom surface at the overhang region of the first lower semiconductor chip and covering a sidewall of the interposer substrate; and a second molding pattern disposed on the first molding pattern and covering a sidewall of the first lower semiconductor chip and sidewalls of the first upper semiconductor chips. A coefficient of thermal expansion of the first molding pattern is greater than a coefficient of thermal expansion of the semiconductor die.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1A:
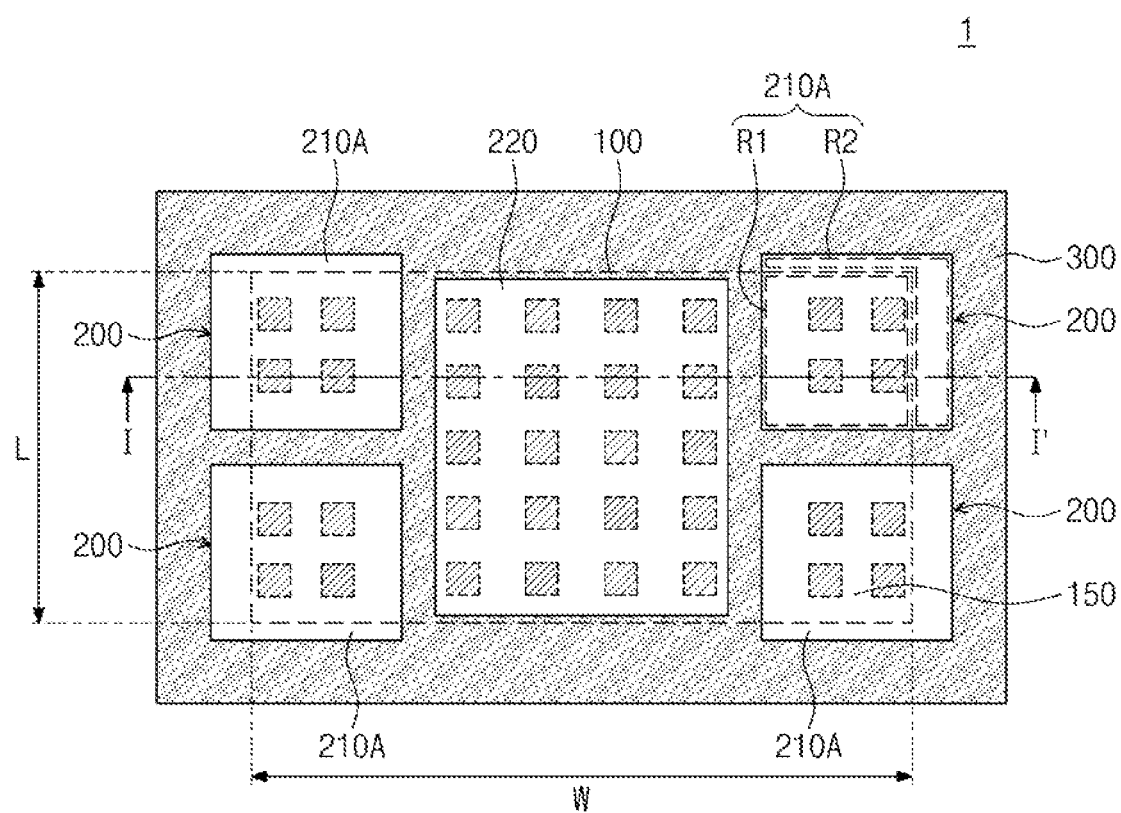
FIG. 1A is a plan view showing a semiconductor package according to embodiments of the present disclosure.

In this description, like reference numerals may indicate like components. The following will now describe semiconductor packages and their fabricating methods according to embodiments of the present disclosure.

Figure 1B:
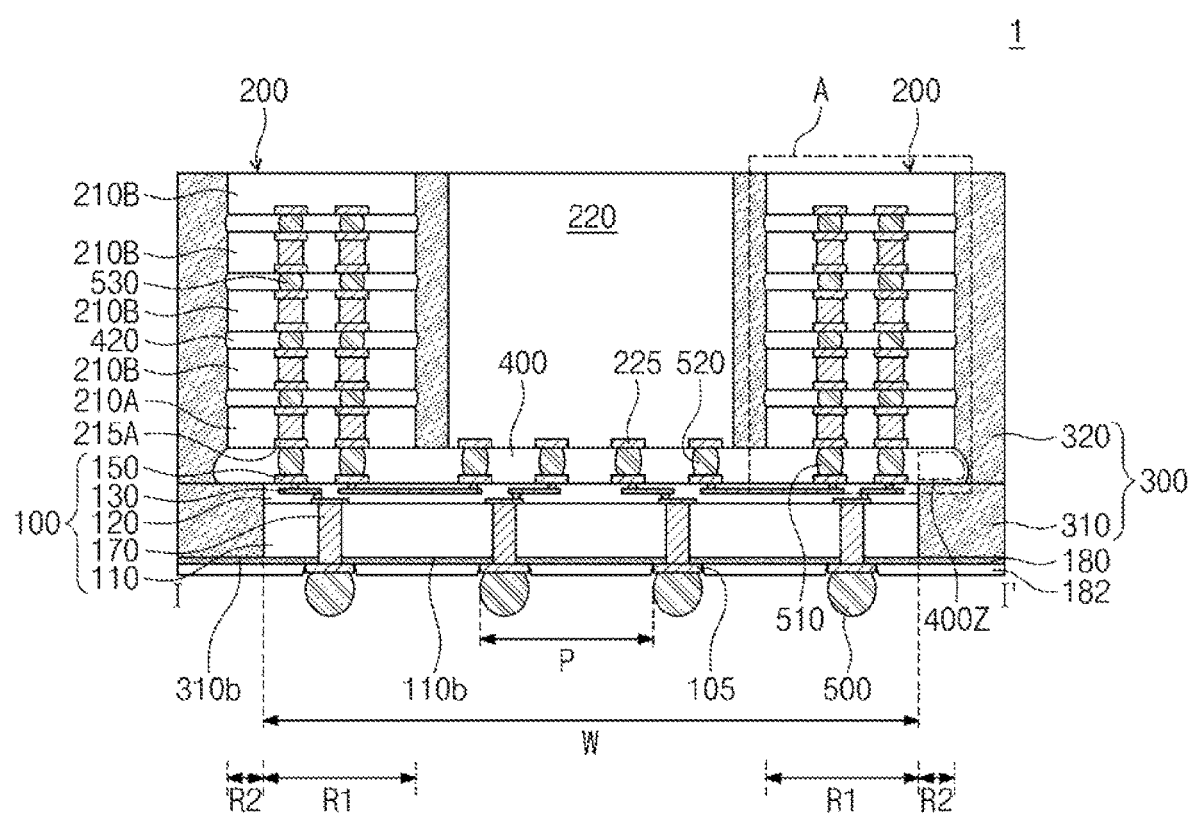
FIG. 1B is a cross-sectional view taken along line I-I' of FIG. 1A.
Figure 1C:
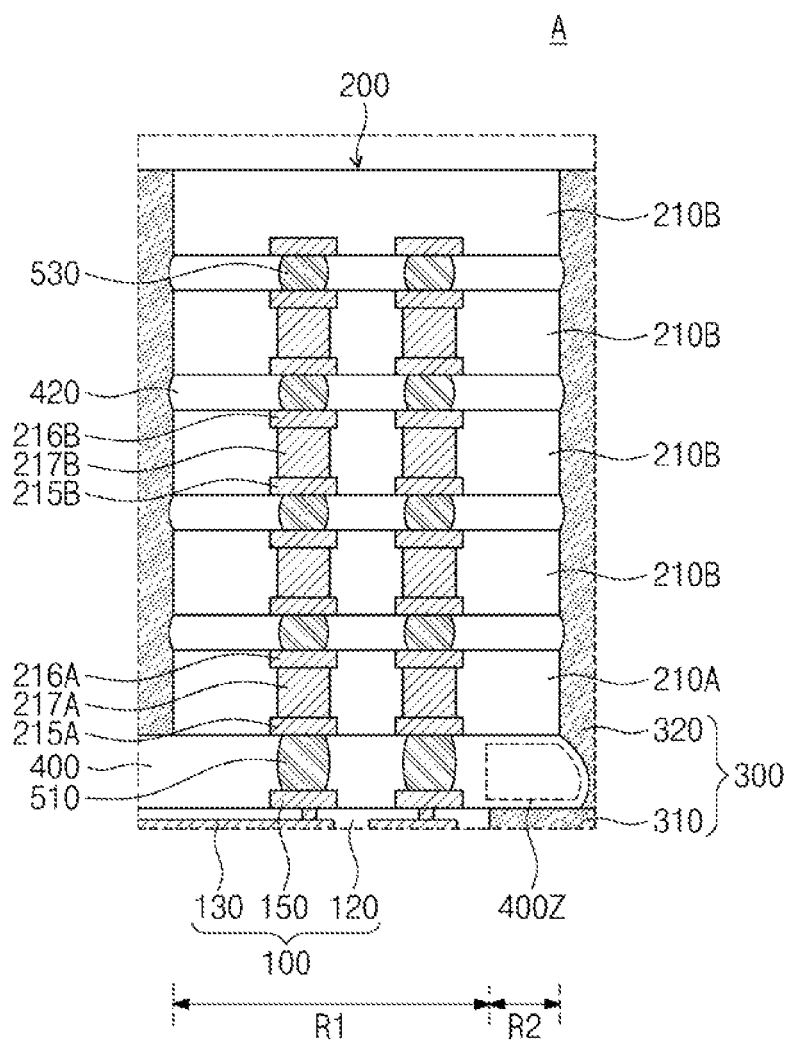
FIG. 1C is an enlarged view showing section A of FIG. 1B.

FIG. 1A is a plan view showing a semiconductor package according to embodiments of the present disclosure. FIG. 1B is a cross-sectional view taken along line I-I' of FIG. 1A. FIG. 1C is an enlarged view showing section A of FIG. 1B.

Referring to FIGS. 1A to 1C, a semiconductor package may include a first package 1. The first package 1 may include coupling solders 500, a substrate 100, a chip stack 200, a second semiconductor chip 220, and a molding layer 300. The first package 1 may further include first bumps 510, second bumps 520, an under-fill layer 400, a first passivation pattern 180, and a second passivation pattern 182.

The substrate 100 may be an interposer substrate 100. As shown in FIG. 1B, the interposer substrate 100 may include a semiconductor die 110, through vias 170, a dielectric layer 120, wiring structures 130, and interposer pads 150. The interposer substrate 100 might not include an integrated circuit such as transistors. The semiconductor die 110 may have a relatively low coefficient of thermal expansion (CTE). For example, the semiconductor die 110 may have its coefficient of thermal expansion (CTE) of about 3.2 ppm/C to about 4.2 ppm/° C. The semiconductor die 110 may include a silicon die, a germanium die, or a silicon-germanium die. The semiconductor die 110 may have a top surface and a bottom surface 110b that are opposite to each other. The through vias 170 may be disposed in the semiconductor die 110. The through vias 170 may include a conductive material, such as metal. The through vias 170 may be electrically separated from each other. The through vias 170 may penetrate the top surface and the bottom surface 110b of the semiconductor die 110. A bottom surface of the interposer substrate 100 may be the bottom surface 110b of the semiconductor die 110.

A wiring layer may be disposed on the top surface of the semiconductor die 110. The wiring layer may include the dielectric layer 120 and the wiring structures 130. The dielectric layer 120 may include a plurality of layers. The dielectric layer 120 may include a silicon-based dielectric material, such as one or more of silicon oxide, silicon nitride, silicon oxynitride, and tetraethylorthosilicate (TEOS). The wiring structures 130 may be disposed in the dielectric layer 120. The wiring structures 130 may include conductive lines and conductive vias. Major axes of the conductive lines may be substantially parallel to the bottom surface 110b of the semiconductor die 110. Major axes of the conductive vias may be substantially parallel to the bottom surface 110b of the semiconductor die 110. The conductive vias may be connected to the conductive lines. The wiring structures 130 may include metal, such as copper, tungsten, titanium, or any alloy thereof.

The interposer pads 150 may be disposed on a top surface of the interposer substrate 100. For example, the interposer pads 150 may be disposed on and coupled to the wiring structures 130. The wiring structures 130 may include a first wiring structure and a second wiring structure. Two interposer pads 150 may be electrically connected to each other through the first wiring structure. One of the interposer pads 150 may be electrically connected to one of the through vias 170 through the second wiring structure. The second wiring structure may be electrically separated from the first wiring structure. The phrase "electrically connected to the interposer substrate 100" may mean "electrically connected to at least one of the wiring structures 130." The expression "two components are electrically connected/coupled to each other" may include the meaning "the two components are directly connected to each other or indirectly connected to each other through other conductive component(s)."

The coupling solders 500 may be disposed on the bottom surface of the interposer substrate 100 and may be coupled to the through vias 170. The coupling solders 500 may include solder balls or electrically connective contacts of some other shape. The solder balls may include a solder material, such as tin (Sn), silver (Ag), zinc (Zn), or any alloy thereof. Solder pads 105 may further be interposed between the coupling solders 500 and the through vias 170. The solder pads 105 may include a material different from that of the solder ball. The solder pads 105 may include metal, such as copper, gold, or nickel.

The chip stack 200 may be disposed on the top surface at an edge region of the interposer substrate 100. The chip stack 200 may be provided in plural. Each of the plurality of chip stacks 200 may include a first lower semiconductor chip 210A and a first upper semiconductor chip 210B. In a plan view, the first lower semiconductor chip 210A may have a mount region R1 and an overhang region R2. The mount region R1 of the first lower semiconductor chip 210A may be disposed on the top surface of the interposer substrate 100. In a plan view, the mount region R1 of the first lower semiconductor chip 210A may overlap the interposer substrate 100. The mount region R1 of the first lower semiconductor chip 210A may include a central region of the first lower semiconductor chip 210A, but the present inventive concepts are not necessarily limited thereto. In a plan view, the overhang region R2 of the first lower semiconductor chip 210A may be spaced apart from the interposer substrate 100. The overhang region R2 of the first lower semiconductor chip 210A may include an edge region of the first lower semiconductor chip 210A. In a plan view, the edge region of the first lower semiconductor chip 210A may be disposed between the central region of the first lower semiconductor chip 210A and a lateral surface of the first lower semiconductor chip 210A.

The first lower semiconductor chip 210A may be a logic chip or a controller chip. The first lower semiconductor chip 210A may control a plurality of first upper semiconductor chips 210B. The first lower semiconductor chip 210A may include first integrated circuits. As shown in FIG. 1C, the first lower semiconductor chip 210A may include first lower pads 215A, first through electrodes 217A, and first upper pads 216A. The first integrated circuits may be disposed in the first lower semiconductor chip 210A. The first lower pads 215A may be disposed on a bottom surface at the mount region R1 of the first lower semiconductor chip 210A. In a plan view, the first lower pads 215A may be located on the central region of the first lower semiconductor chip 210A. The first lower pads 215A might not be disposed on a bottom surface at the overhang region R2 of the first lower semiconductor chip 210A. The first lower pads 215A may be electrically connected to the first integrated circuits. The first lower pads 215A may have a pitch that is less than a pitch P of the coupling solders 500.

The first through electrodes 217A may be disposed in the first lower semiconductor chip 210A. Each of the first through electrodes 217A may be coupled to at least one selected from the first lower pads 215A and the first integrated circuits. In a plan view, the first through electrodes 217A may be located on the central region of the first lower semiconductor chip 210A. The first upper pads 216A may be disposed on a top surface of the first lower semiconductor chip 210A and may be coupled to the first through electrodes 217A. In a plan view, the first upper pads 216A may be located on the central region of the first lower semiconductor chip 210A, but the present inventive concepts are not necessarily limited thereto. The first lower pads 215A, the first through electrodes 217A, and the first upper pads 216A may each include metal.

The first upper semiconductor chip 210B may be disposed on the first lower semiconductor chip 210A. Each of the chip stacks 200 may include a plurality of first upper semiconductor chips 210B. In this case, the first upper semiconductor chips 210B may be vertically stacked. In this description, the term "vertical/vertically" may mean "vertical/vertically to the bottom surface 110b of the semiconductor die 110." The first upper semiconductor chips 210B may be of a different type from that of the first lower semiconductor chip 210A. For example, the first upper semiconductor chips 210B may be memory chips. The memory chips may include high bandwidth memory (HBM) chips.

Each of the first upper semiconductor chips 210B may include second integrated circuits, second lower pads 215B, second through electrodes 217B, and second upper pads 216B. The second integrated circuits may be disposed in each of the first upper semiconductor chips 210B. The second lower pads 215B and the second upper pads 216B may be respectively disposed on a bottom surface and a top surface of the first upper semiconductor chip 210B that corresponds thereto. The second lower pads 215B and the second upper pads 216B may be electrically connected to the second integrated circuits of the first upper semiconductor chip 210B that corresponds thereto. The second through electrodes 217B may be located in the first upper semiconductor chip 210B that corresponds thereto, and may be coupled to the second lower pads 215B and the second upper pads 216B. The second through electrodes 217B may further be coupled to the second integrated circuits. An uppermost one of the first upper semiconductor chips 210B may include the second integrated circuits and the second lower pads 215B, but might not include the second through electrodes 217B or the second upper pads 216B. The uppermost first upper semiconductor chip 210B may have a thickness that is greater than those of other first upper semiconductor chips 210B.

In a plan view, the second lower pads 215B, the second through electrodes 217B, and the second upper pads 216B may be disposed on central regions of the first upper semiconductor chips 210B that correspond thereto. The first upper semiconductor chips 210B may be disposed on their edge regions with the second lower pads 215B, the second through electrodes 217B, or the second upper pads 216B. In this case, the first upper pads 216A may be disposed on the top surface at the edge region of the first lower semiconductor chip 210A and might not be vertically aligned with the first through electrodes 217A. Each of the first upper semiconductor chips 210B may further include redistribution lines disposed between the first upper pads 216A and the first through electrodes 217A. The first upper pads 216A may be coupled through the redistribution lines to the first through electrodes 217A.

First bumps 510 may be interposed between and electrically connected to the interposer substrate 100 and the first lower semiconductor chip 210A. In this description, the phrase "electrically connected to a semiconductor chip" may mean "electrically connected to integrated circuits in the semiconductor chip." The first bumps 510 may be correspondingly interposed between the first lower pads 215A and the interposer pads 150. In a plan view, the first bumps 510 may overlap the central region of the first lower semiconductor chip 210A. The first bumps 510 may include solder balls. The first bumps 510 may further include pillar patterns. The first bumps 510 may have a pitch that is less than the pitch P of the coupling solders 500.

Each of the chip stacks 200 may further include upper bumps 530. The upper bumps 530 may be interposed between the first upper semiconductor chips 210B and may be correspondingly coupled to the second lower pads 215B and the second upper pads 216B. The upper bumps 530 may further be interposed between the first lower semiconductor chip 210A and a lowermost one of the first upper semiconductor chips 210B, and may thus be coupled to the first upper pads 216A and the second lower pads 215B of the lowermost first upper semiconductor chip 210B. The first upper semiconductor chips 210B may be electrically connected through the upper bumps 530 to the first lower semiconductor chip 210A and the interposer substrate 100. In a plan view, the upper bumps 530 may vertically overlap the central regions of the first upper semiconductor chips 210B, but the present inventive concepts are not necessarily limited thereto.

The upper bumps 530 may have a pitch that is less than the pitch P of the coupling solders 500. Each of the upper bumps 530 may include a solder, a pillar, or a combination thereof. The upper bumps 530 may include a solder material or copper. Alternatively, the upper bumps 530 may be omitted. In this case, the second lower pads 215B of one first upper semiconductor chip 210B may be directly bonded to the second upper pads 216B of another first upper semiconductor chip 210B adjacent to the one first upper semiconductor chip 210B. The first lower semiconductor chip 210A may be directly bonded to the lowermost first upper semiconductor chip 210B.

Each of the chip stacks 200 may further include under-fill patterns 420. The under-fill patterns 420 may be disposed in a first upper gap between the first lower semiconductor chip 210A and the lowermost first upper semiconductor chip 210B and in second upper gaps between the first upper semiconductor chips 210B. Each of the under-fill patterns 420 may encapsulate corresponding upper bumps 530. The under-fill patterns 420 may include a dielectric polymer, such as an epoxy-based polymer.

The second semiconductor chip 220 may be disposed on the top surface at a central region of the interposer substrate 100. In a plan view, the second semiconductor chip 220 may completely overlap the interposer substrate 100. In a plan view, the second semiconductor chip 220 may be located between the chip stacks 200. For example, the second semiconductor chip 220 may be laterally spaced apart from the first lower semiconductor chip 210A and the first upper semiconductor chips 210B. The phrase "two components are laterally spaced apart from each other" may mean "two components are horizontally spaced apart from each other." The term "horizontal/horizontally" may indicate "parallel to the bottom surface 110b of the semiconductor die 110." The second semiconductor chip 220 may be of a different type from the first lower semiconductor chip 210A and the first upper semiconductor chips 210B. For example, the second semiconductor chip 220 may include a logic chip, a buffer chip, or a system-on-chip (SOC). The second semiconductor chip 220 may be, for example, a logic chip whose function is different from that of the first lower semiconductor chip 210A. The second semiconductor chip 220 may be, for example, an application specific integrated circuit (ASIC) chip or an application processor (AP) chip. The ASIC chip may include an application specific integrated circuit (ASIC). The second semiconductor chip 220 may include a central processing unit (CPU) or a graphic processing unit (GPU).

The second semiconductor chip 220 may include integrated circuits and chip pads 225. The integrated circuits may be disposed in the second semiconductor chip 220. The chip pads 225 may be disposed on a bottom surface of the second semiconductor chip 220 and may be electrically connected to the integrated circuits of the second semiconductor chip 220. The number of chip pads 225 in the second semiconductor chip 220 may be greater than the number of first lower pads 215A in the first lower semiconductor chip 210A. For example, the number of chip pads 225 in the second semiconductor chip 220 may be equal to or greater than twice the number of first lower pads 215A in a single first lower semiconductor chip 210A.

Second bumps 520 may be interposed between the interposer substrate 100 and the second semiconductor chip 220. For example, the second bumps 520 may be correspondingly coupled to the interposer pads 150 and the chip pads 225 of the second semiconductor chip 220. The second semiconductor chip 220 may be electrically connected through the interposer substrate 100 to the chip stacks 200 or the coupling solders 500. The second bumps 520 may include solder balls. The second bumps 520 may further include pillar patterns. The second bumps 520 may have a pitch that is less than the pitch P of the coupling solders 500.

The under-fill layer 400 may be disposed on bottom surfaces of the chip stacks 200 and the bottom surface of the second semiconductor chip 220. The under-fill layer 400 may be disposed in first gaps between the interposer substrate 100 and the chip stacks 200, thereby covering sidewalls of the first bumps 510. The under-fill layer 400 may be disposed in second gaps between the interposer substrate 100 and the second semiconductor chip 220, thereby covering sidewalls of the second bumps 520. The under-fill layer 400 may be disposed on the bottom surface at the overhang region R2 of the first lower semiconductor chip 210A. The under-fill layer 400 may have a distal end 400Z spaced apart from the interposer substrate 100. The under-fill layer 400 may have a width that is greater than a width W of the interposer substrate 100. Unless otherwise specified, a width of a certain component may be measured in a direction parallel to the bottom surface 110b of the semiconductor die 110. The under-fill layer 400 may include a dielectric polymer, such as an epoxy-based polymer.

The molding layer 300 may be disposed on the interposer substrate 100. The molding layer 300 may include a first molding pattern 310 and a second molding pattern 320. The first molding pattern 310 may be disposed on the bottom surface at the overhang region R2 of the first lower semiconductor chip 210A. The first molding pattern 310 may cover sidewalls of the interposer substrate 100. The first molding pattern 310 may be in direct contact with the sidewalls of the interposer substrate 100. In a plan view, the first molding pattern 310 may at least partially surround the interposer substrate 100. The first molding pattern 310 may protect the interposer substrate 100. The molding layer 300 may have a coefficient of thermal expansion (CTE) of about 6 ppm/° C. to 20 ppm/° C. The coefficient of thermal expansion (CTE) of the molding layer 300 may be CTE alpha 1. The CTE alpha 1 may be a coefficient of thermal expansion below a glass transition temperature (Tg).

The first molding pattern 310 may have a top surface and a bottom surface 310b that are opposite to each other. The bottom surface 310b of the first molding pattern 310 may be a bottom surface of the molding layer 300. For example, the top surface of the first molding pattern 310 may be located at substantially the same level as that of a top surface of the dielectric layer 120, but the present inventive concepts are not necessarily limited thereto. The phrase "certain components are the same in terms of level" may include an allowable tolerance possibly occurring during fabrication process. In this description, the term "level" may mean a vertical level. The bottom surface of the molding layer 300 may be coplanar with that of the interposer substrate 100. For example, the bottom surface 310b of the first molding pattern 310 may be coplanar with the bottom surface 110b of the semiconductor die 110. The under-fill layer 400 may be disposed on the top surface of the first molding pattern 310. For example, the distal end 400Z of the under-fill layer 400 may be interposed between the first molding pattern 310 and the first lower semiconductor chip 210A.

The first molding pattern 310 may have a coefficient of thermal expansion (CTE) less than that of the interposer substrate 100. For example, the coefficient of thermal expansion (CTE) of the first molding pattern 310 may be less than that of the semiconductor die 110. For example, the coefficient of thermal expansion (CTE) of the first molding pattern 310 may range from about 6 ppm/° C. to about 20 ppm/° C. In this case, the coefficient of thermal expansion (CTE) of the first molding pattern 310 may be CTE alpha 1. The first molding pattern 310 may include a first dielectric polymer. The first dielectric polymer may include, for example, an epoxy-based molding compound. The first dielectric polymer may have a material different from that of the under-fill layer 400 and that of the under-fill pattern 420. The first molding pattern 310 may further include first fillers. The first fillers may be disposed in the first dielectric polymer. The first fillers may include an inorganic material such as silica.

The second molding pattern 320 may be disposed on the first molding pattern 310 and the interposer substrate 100. The second molding pattern 320 may cover sidewalls of the chip stacks 200 and a sidewall of the second semiconductor chip 220. For example, the second molding pattern 320 may cover a sidewall of the first lower semiconductor chip 210A and sidewalls of the first upper semiconductor chips 210B. The second molding pattern 320 may further cover the under-fill layer 400. The second molding pattern 320 may be directly located on the top surface of the first molding pattern 310. The second molding pattern 320 may have a top surface that is coplanar with that of the uppermost first upper semiconductor chip 210B and that of the second semiconductor chip 220. The second molding pattern 320 may further cover top surfaces of the chip stacks 200 and the top surface of the second semiconductor chip 220. Each of the top surfaces of the chip stacks 200 may be a top surface of the uppermost first upper semiconductor chip 210B.

The second molding pattern 320 may include a second dielectric polymer. The second dielectric polymer may include, for example, an epoxy-based molding compound. The second dielectric polymer may have a material different from that of the under-fill layer 400 and that of the under-fill pattern 420. The second molding pattern 320 may further include second fillers. In some embodiments of the present disclosure, the second molding pattern 320 may include the same material of the first molding pattern 310. In some embodiments of the present disclosure, the second molding pattern 320 may include a different material from that of the first molding pattern 310. In this case, the second dielectric polymer may be different from the first dielectric polymer, and the second fillers may be different from the first fillers. For example, the second molding pattern 320 may have a coefficient of thermal expansion (CTE) of about 6 ppm/° C. to about 20 ppm/° C., but the present inventive concepts are not necessarily limited thereto. In this case, the coefficient of thermal expansion (CTE) of the second molding pattern 320 may be CTE alpha 1.

The second molding pattern 320 may have a width and a length substantially the same as those of the first molding pattern 310. A length of a certain component may be measured in a direction parallel to the semiconductor die 110. A length direction of the certain component may be substantially perpendicular to a width direction of the certain component. The second molding pattern 320 may have outer walls aligned with those of the first molding pattern 310.

According to some embodiments of the present disclosure, the interposer substrate 100 may have a relatively small width W and a relatively small length L. For example, the width W and the length L of the interposer substrate 100 may be less than those of the molding layer 300. The interposer substrate 100 may have a relatively small planar area. Therefore, the interposer substrate 100 may have an increased active area fraction. The active area fraction of the interposer substrate 100 may be a ratio of planar areas of the interposer pads 150 to a planar area of the interposer substrate 100. Because the interposer substrate 100 has a small planar area, it may be possible to simplify the formation of the interposer substrate 100, the formation of the wiring structure 130, and the formation of the interposer pads 150.

The first passivation pattern 180 may be disposed on the bottom surface of the interposer substrate 100 and the bottom surface 310b of the first molding pattern 310. The first passivation pattern 180 may cover the bottom surface 110b of the semiconductor die 110 and the bottom surface 310b of the first molding pattern 310. The first passivation pattern 180 may further cover lower sidewalls of the through vias 170. The first passivation pattern 180 may have a bottom surface at substantially the same level as that of bottom surfaces of the through vias 170. The first passivation pattern 180 may have outer walls aligned with those of the molding layer 300. The first passivation pattern 180 may include a dielectric material, such as silicon nitride.

The second passivation pattern 182 may be located on and cover the bottom surface of the first passivation pattern 180. The second passivation pattern 182 may have outer walls aligned with those of the first passivation pattern 180 and those of the molding layer 300. The second passivation pattern 182 may include a different material from that of the first passivation pattern 180. The second passivation pattern 182 may include an organic dielectric material, such as photosensitive polyimide (PSPI). The first and second passivation patterns 180 and 182 may protect the interposer substrate 100.

Figure 2A:
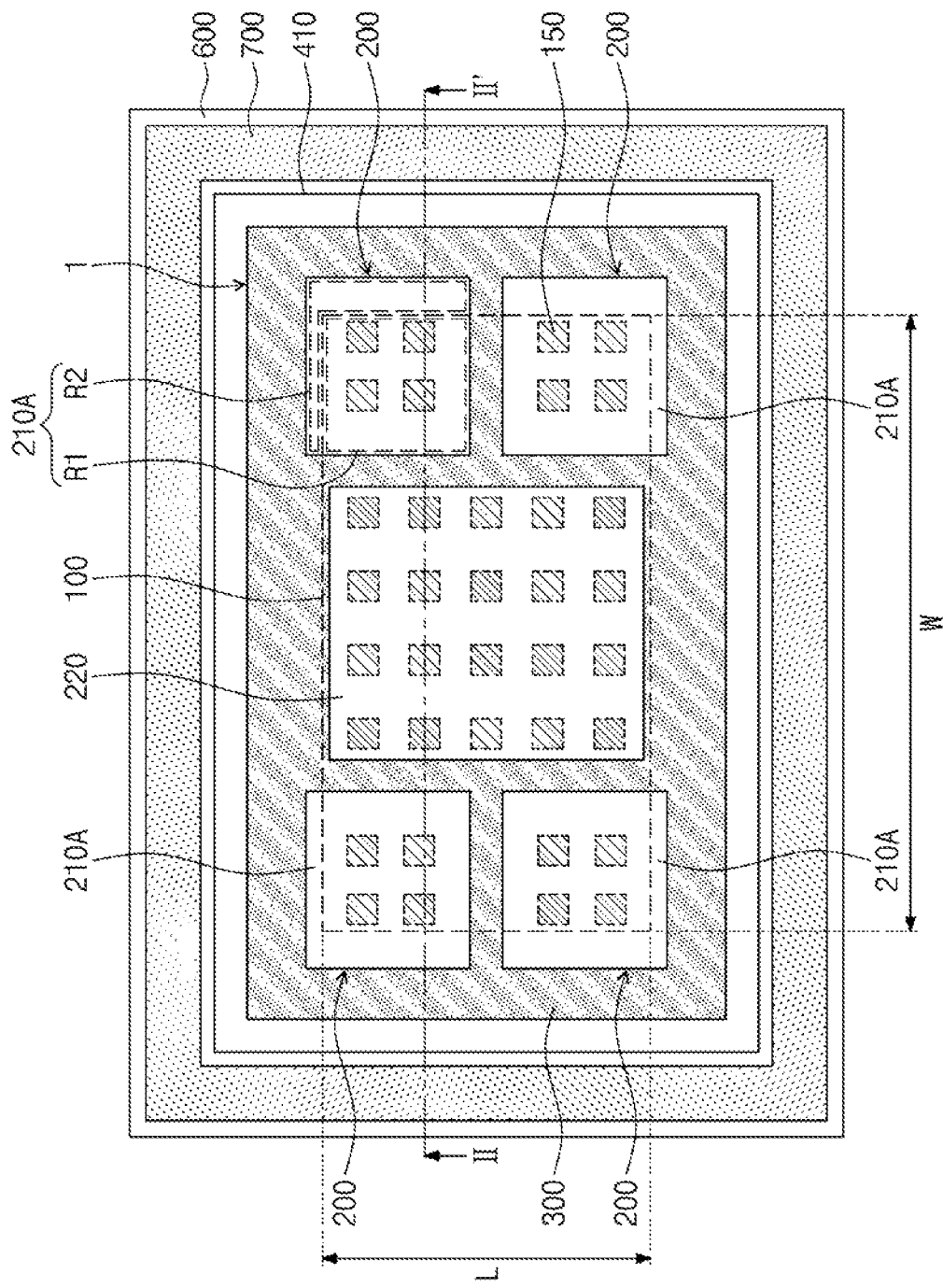
FIG. 2A is a plan view showing a semiconductor package according to embodiments of the present disclosure.
Figure 2B:
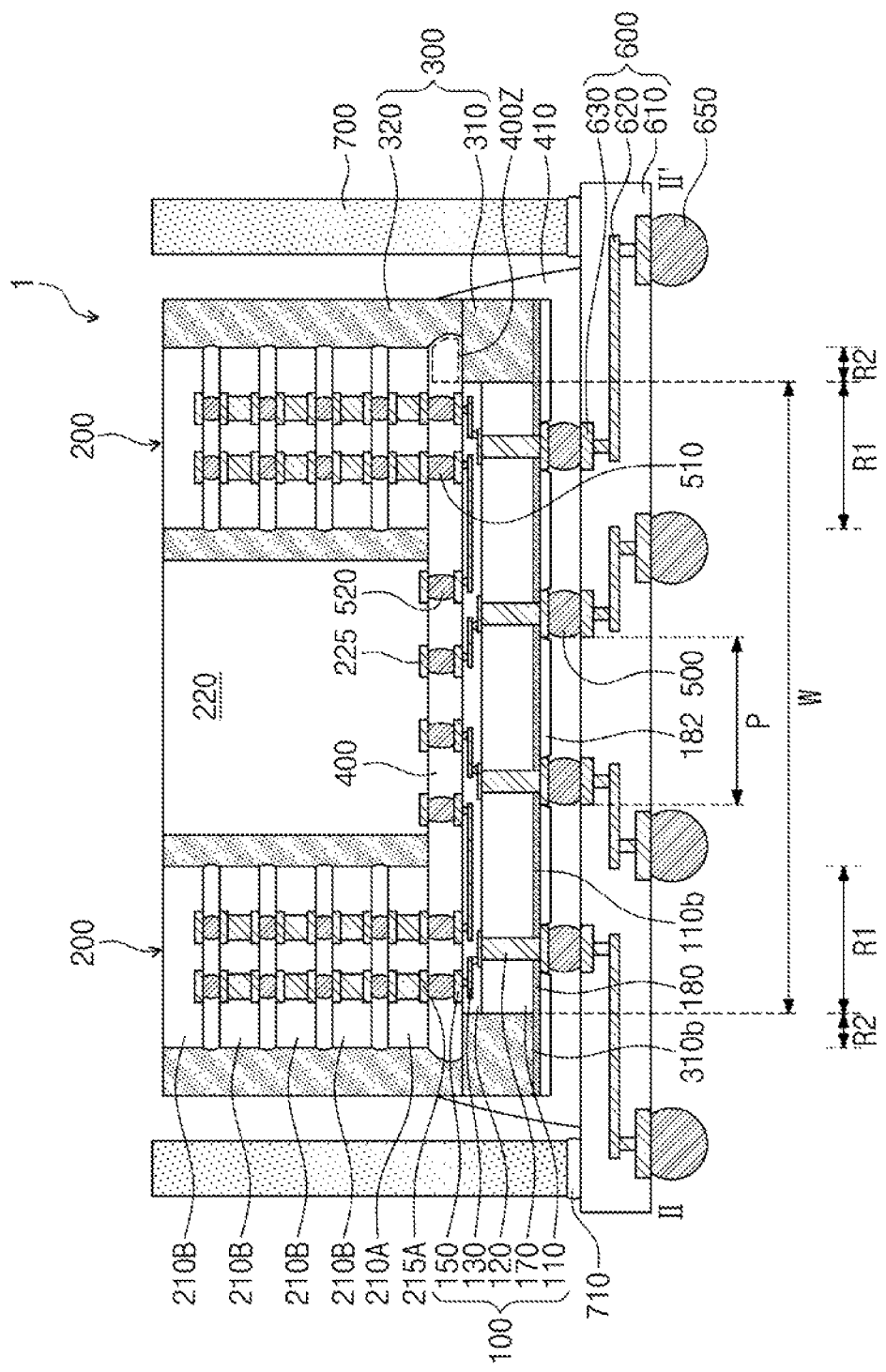
FIG. 2B is a cross-sectional view taken along line II-II' of FIG. 2A.

FIG. 2A is a plan view showing a semiconductor package according to some embodiments of the present disclosure. FIG. 2B is a cross-sectional view taken along line II-II' of FIG. 2A.

Referring to FIGS. 2A and 2B, a semiconductor package may include a first package 1, solder terminals 650, a package substrate 600, a lower under-fill layer 410, a stiffener 700, and an adhesive layer 710. The first package 1 may be substantially the same as that discussed above in FIGS. 1A and 1B. For example, the first package 1 may include the coupling solders 500, the interposer substrate 100, the chip stacks 200, the second semiconductor chip 220, and the molding layer 300. The first package 1 may further include the first bumps 510, the second bumps 520, the under-fill layer 400, the first passivation pattern 180, and the second passivation pattern 182.

The package substrate 600 may include, for example, a printed circuit board (PCB). The package substrate 600 may have a central region and an edge region, in a plan view. In a plan view, the edge region of the package substrate 600 may be disposed between a lateral surface of the package substrate 600 and the central region of the package substrate 600.

The package substrate 600 may include a dielectric base layer 610, conductive patterns 620, and substrate pads 630. The dielectric base layer 610 may include multiple layers. Alternatively, the dielectric base layer 610 may be a single layer. The substrate pads 630 may be disposed on a top surface of the package substrate 600. The conductive patterns 620 may be located in the dielectric base layer 610 and may be coupled to the substrate pads 630. The phrase "electrically connected to the package substrate 600" may mean "electrically connected to at least one of the conductive patterns 620." The substrate pads 630 and the conductive patterns 620 may include metal, such as one or more of copper, aluminum, tungsten, and titanium.

The solder terminals 650 may be disposed on a bottom surface of the package substrate 600 and may be electrically connected to the conductive patterns 620. External electrical signals may be transferred to the solder terminals 650. The solder terminals 650 may include solder balls.

The first package 1 may be located on the package substrate 600. For example, the interposer substrate 100 may be disposed on the top surface at a central region of the package substrate 600. The coupling solders 500 may be coupled to corresponding substrate pads 630. Therefore, the chip stacks 200 and the second semiconductor chip 220 may be electrically connected through the interposer substrate 100 to the package substrate 600.

The package substrate 600 may have a coefficient of thermal expansion (CTE) that is greater than that of the interposer substrate 100. For example, the coefficient of thermal expansion (CTE) of the package substrate 600 may be greater than that of the semiconductor die 110. A difference in coefficient of thermal expansion (CTE) between the package substrate 600 and the semiconductor die 110 may induce a stress applied to the interposer substrate 100. The stress may be concentrated on the edge region of the interposer substrate 100. The stress may cause either the molding layer 300 or the lower under-fill layer 410 to delaminate from the interposer substrate 100. The lower width and length of a certain component, the less stress caused by a coefficient of thermal expansion. According to some embodiments of the present disclosure, the width W and the length L of the interposer substrate 100 may be less than those of the first molding pattern 310. Therefore, it may be possible to reduce the stress applied to the edge region of the interposer substrate 100. Even when the semiconductor package operates repeatedly, the first molding pattern 310 may be prevented from delaminating from the interposer substrate 100.

The difference in coefficient of thermal expansion (CTE) between the package substrate 600 and the semiconductor die 110 may produce warpage of the semiconductor package. The molding layer 300 may have a coefficient of thermal expansion (CTE) that is greater than that of the interposer substrate 100. For example, the coefficient of thermal expansion (CTE) of the first molding pattern 310 may be greater than that of the semiconductor die 110. Therefore, the difference in coefficient of thermal expansion (CTE) between the package substrate 600 and the semiconductor die 110 may be counterbalanced by a difference in coefficient of thermal expansion (CTE) between the first molding pattern 310 and the semiconductor die 110. Because the width W and the length L of the interposer substrate 100 are relatively small, and because the first molding pattern 310 is disposed on the sidewalls of the interposer substrate 100, the molding layer 300 may have an increased volume, and the semiconductor die 110 may have a reduced volume. Therefore, the difference in coefficient of thermal expansion (CTE) between the molding layer 300 and the semiconductor die 110 may effectively counterbalance the difference in coefficient of thermal expansion (CTE) between the package substrate 600 and the semiconductor die 110. Accordingly, the semiconductor package may be prevented from warping. The semiconductor package may increase in operating reliability.

The lower under-fill layer 410 may be disposed in a gap between the package substrate 600 and the interposer substrate 100, thereby covering sidewalls of the coupling solders 500. The lower under-fill layer 410 may protect the coupling solders 500. The lower under-fill layer 410 may further cover the outer walls of the first and second passivation patterns 180 and 182 and the outer walls of the first molding pattern 310. The lower under-fill layer 410 may further extend onto lower portions of the outer walls of the second molding pattern 320. The lower under-fill layer 410 may be spaced apart from the interposer substrate 100. The lower under-fill layer 410 may include a dielectric polymer, such as an epoxy-based polymer. However, the lower under-fill layer 410 may include a different material from that of the molding layer 300. The lower under-fill layer 410 may have a coefficient of thermal expansion (CTE) different from that of the molding layer 300. The coefficient of thermal expansion (CTE) of the lower under-fill layer 410 may be greater than that of the semiconductor die 110. Therefore, the difference in coefficient of thermal expansion (CTE) between the semiconductor die 110 and the package substrate 600 may further be counterbalanced by a difference in coefficient of thermal expansion (CTE) between the lower under-fill layer 410 and the semiconductor die 110.

The stiffener 700 may be located on the top surface at an edge region of the package substrate 600. The stiffener 700 may be laterally spaced apart from the molding layer 300. For example, the stiffener 700 may include one or more of copper, stainless steels (SUS), aluminum silicon carbide (AlSiC), and titanium. The semiconductor package may suffer from warpage at the edge region of the package substrate 600. The stiffener 700 may be relatively stiff to fix the edge region of the package substrate 600. Therefore, the package substrate 600 may be prevented from warping.

The adhesive layer 710 may be interposed between the package substrate 600 and the stiffener 700. The adhesive layer 710 may fix the stiffener 700 to the package substrate 600. The adhesive layer 710 may have dielectric properties or conductive properties. The adhesive layer 710 may include an organic material or metal.

Figure 2C:
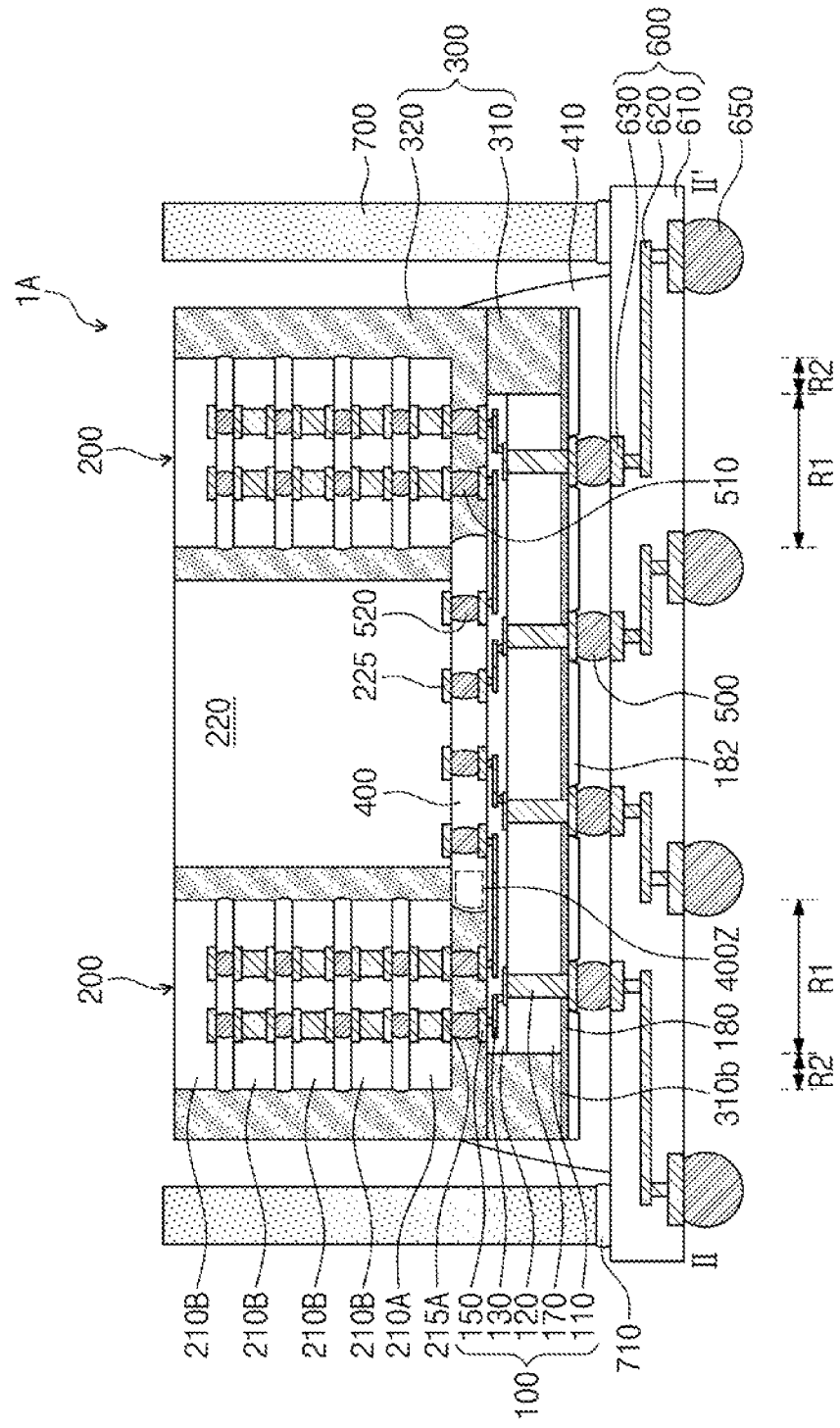
FIG. 2C is a cross-sectional view showing a semiconductor package according to embodiments of the present disclosure.

FIG. 2C is a cross-sectional view taken along line II-IF of FIG. 2A, showing a semiconductor package according to some embodiments of the present disclosure.

Referring to FIG. 2C, a semiconductor package may include a first package 1A, solder terminals 650, a package substrate 600, a lower under-fill layer 410, a stiffener 700, and an adhesive layer 710. The first package 1A may include at least one selected from the coupling solders 500, the interposer substrate 100, the chip stacks 200, the second semiconductor chip 220, the molding layer 300, the first bumps 510, the second bumps 520, the under-fill layer 400, the first passivation pattern 180, and the second passivation pattern 182. The first package 1A may be substantially the same as the first package 1 of FIGS. 1A and 1B. For example, the under-fill layer 400 may be disposed in a second gap between the under-fill layer 400 and the interposer substrate 100, thereby covering the sidewalls of the second bumps 520. However, the under-fill layer 400 might not extend onto the bottom surface at the overhang region R2 of the first lower semiconductor chip 210A. The distal end 400Z of the under-fill layer 400 may be spaced apart from the first molding pattern 310. The distal end 400Z of the under-fill layer 400 may vertically overlap the interposer substrate 100. The distal end 400Z of the under-fill layer 400 may further extend onto the bottom surface at the mount region R1 of the first lower semiconductor chip 210A. In some embodiments of the present disclosure, the distal end 400Z of the under-fill layer 400 might not extend onto the bottom surface of the first lower semiconductor chip 210A.

Figure 2D:
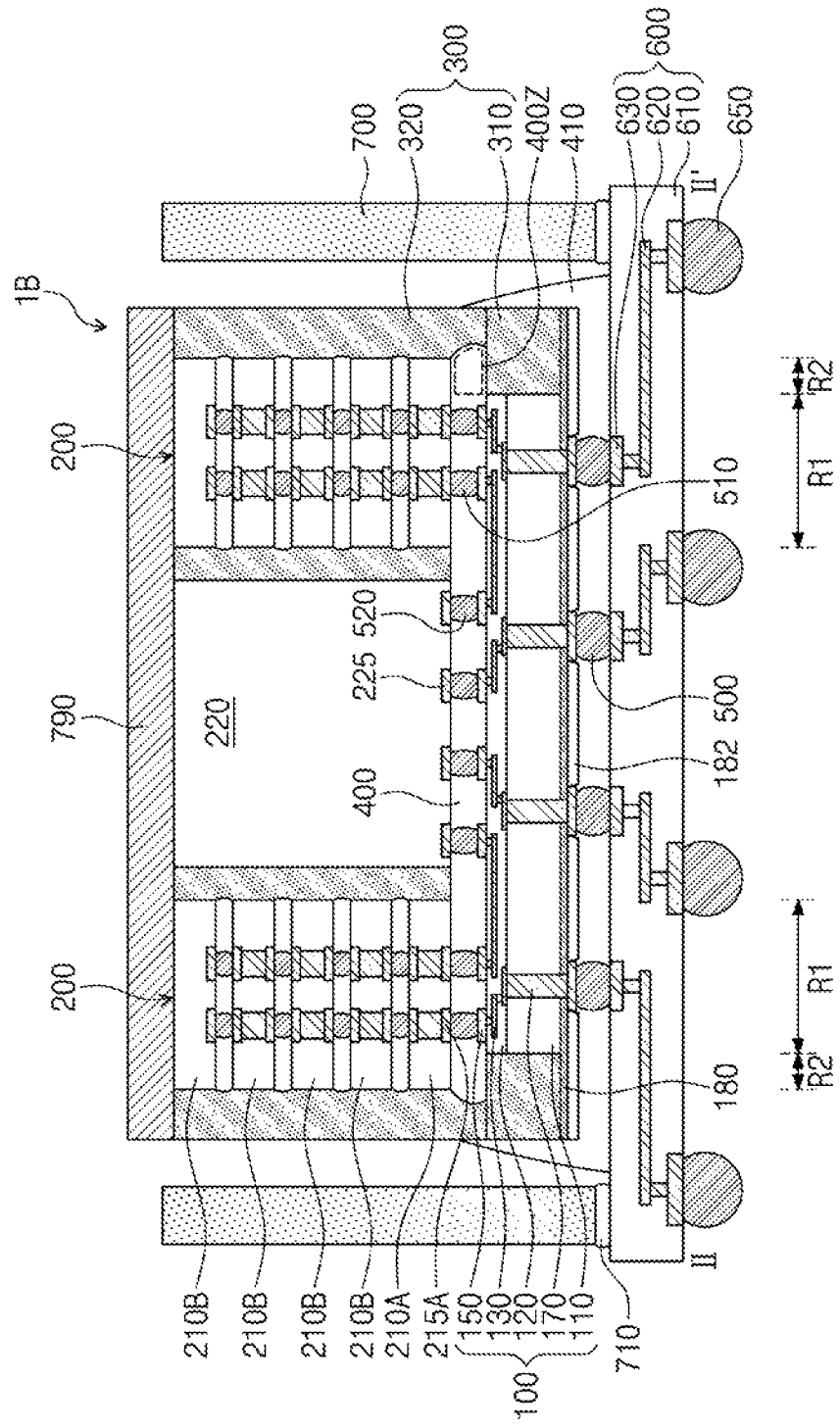
FIG. 2D is a cross-sectional view showing a semiconductor package according to embodiments of the present disclosure.

FIG. 2D is a cross-sectional view taken along line II-IF of FIG. 2A, showing a semiconductor package according to some embodiments of the present disclosure.

Referring to FIG. 2D, a semiconductor package may include a first package 1B, solder terminals 650, a package substrate 600, a lower under-fill layer 410, a stiffener 700, and an adhesive layer 710. The first package 1B may be substantially the same as the first package 1 of FIGS. 1A and 1B. In contrast, the first package 1B may further include a thermal radiator 790.

The thermal radiator 790 may be disposed on at least one selected from the top surface of the second semiconductor chip 220 and the top surfaces of the chip stacks 200. In this case, the molding layer 300 may expose the top surfaces of the chip stacks 200 and the top surface of the second semiconductor chip 220. The thermal radiator 790 may further cover a top surface of the molding layer 300. The thermal radiator 790 may further extend onto the outer walls of the molding layer 300. The thermal radiator 790 may include a heat sink, a heat slug, or a thermal interface material (TIM) layer. The thermal radiator 790 may have a coefficient of thermal expansion (CTE) greater than that of the molding layer 300. When the semiconductor package operates, the thermal radiator 790 may promptly externally discharge heat generated from the chip stacks 200 and/or the second semiconductor chip 220. The thermal radiator 790 may include, for example, copper. The thermal radiator 790 may absorb external physical impacts to thereby protect the second semiconductor chip 220 and the chip stacks 200.

The thermal radiator 790 may be electrically conductive and may serve as an electromagnetic field shield layer. In this case, the thermal radiator 790 may shield electromagnetic interference (EMI) of the chip stacks 200 and the second semiconductor chip 220.

Figure 3:
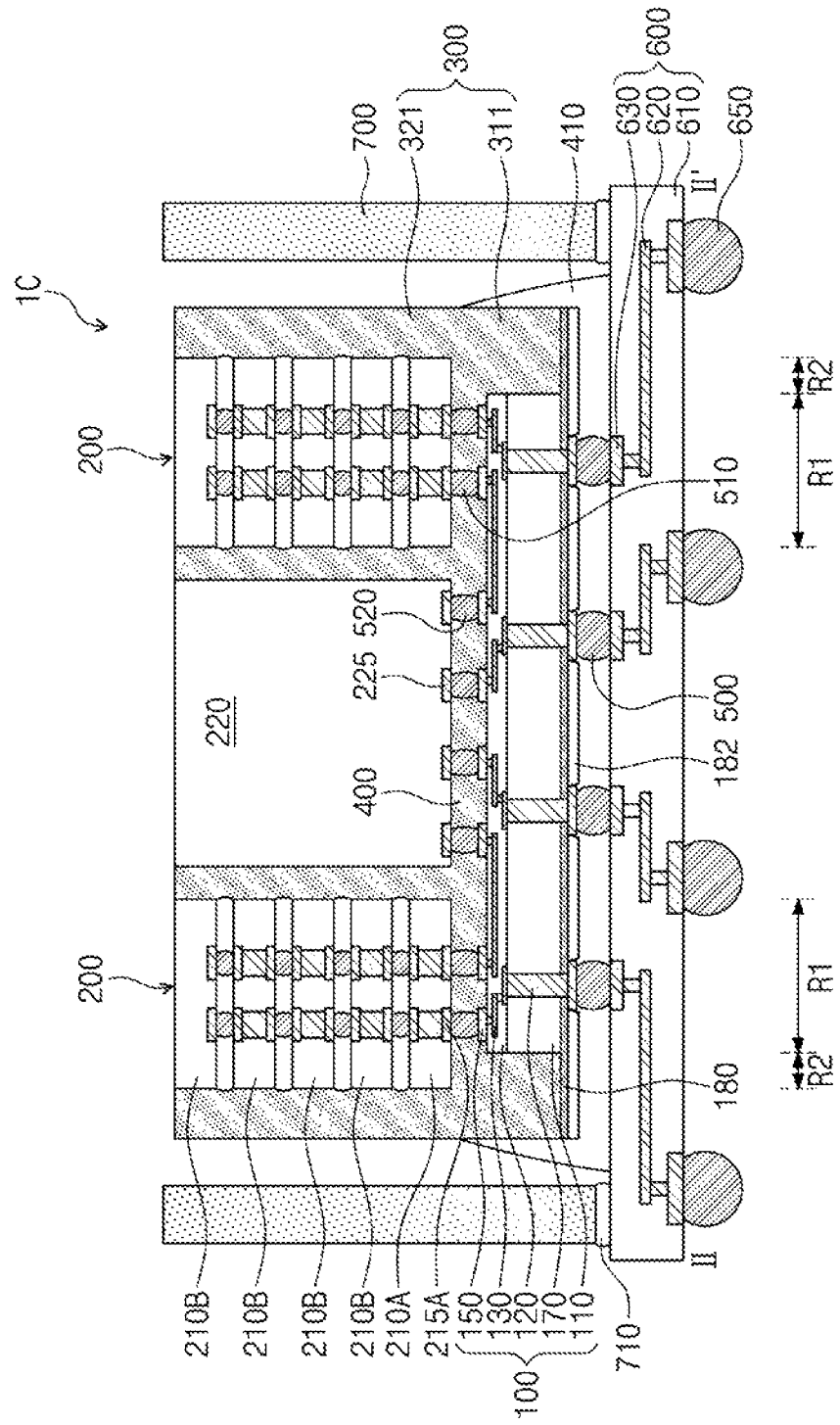
FIG. 3 is a cross-sectional view showing a semiconductor package according to embodiments of the present disclosure.

FIG. 3 is a cross-sectional view taken along line II-IF of FIG. 2A, showing a semiconductor package according to some embodiments of the present disclosure.

Referring to FIG. 3, a semiconductor package may include a first package 1C, solder terminals 650, a package substrate 600, a lower under-fill layer 410, a stiffener 700, and an adhesive layer 710. The first package 1C may be substantially the same as the first package 1 discussed in FIGS. 1A and 1B.

The molding layer 300 may include a first molding pattern 311 and a second molding pattern 321. A displacement of the first and second molding patterns 311 and 321 may be substantially the same as that of the first and second molding patterns 310 and 320 of FIGS. 1A and 1B. In contrast, the second molding pattern 321 may include the same material as that of the first molding pattern 311. For example, a second dielectric polymer of the second molding pattern 321 may be the same as a first dielectric polymer of the first molding pattern 311. An indistinct boundary may be defined between the first molding pattern 311 and the second molding pattern 321.

For example, the first package 1C might not include an under-fill layer (see 400 of FIGS. 1A and 1B). The molding layer 300 may further be disposed between the interposer substrate 100 and the first lower semiconductor chip 210A and between the interposer substrate 100 and the second semiconductor chip 220, thereby encapsulating the first bumps 510 and the second bumps 520. The molding layer 300 may be in direct contact with the top surface of the dielectric layer 120.

Figure 4A:
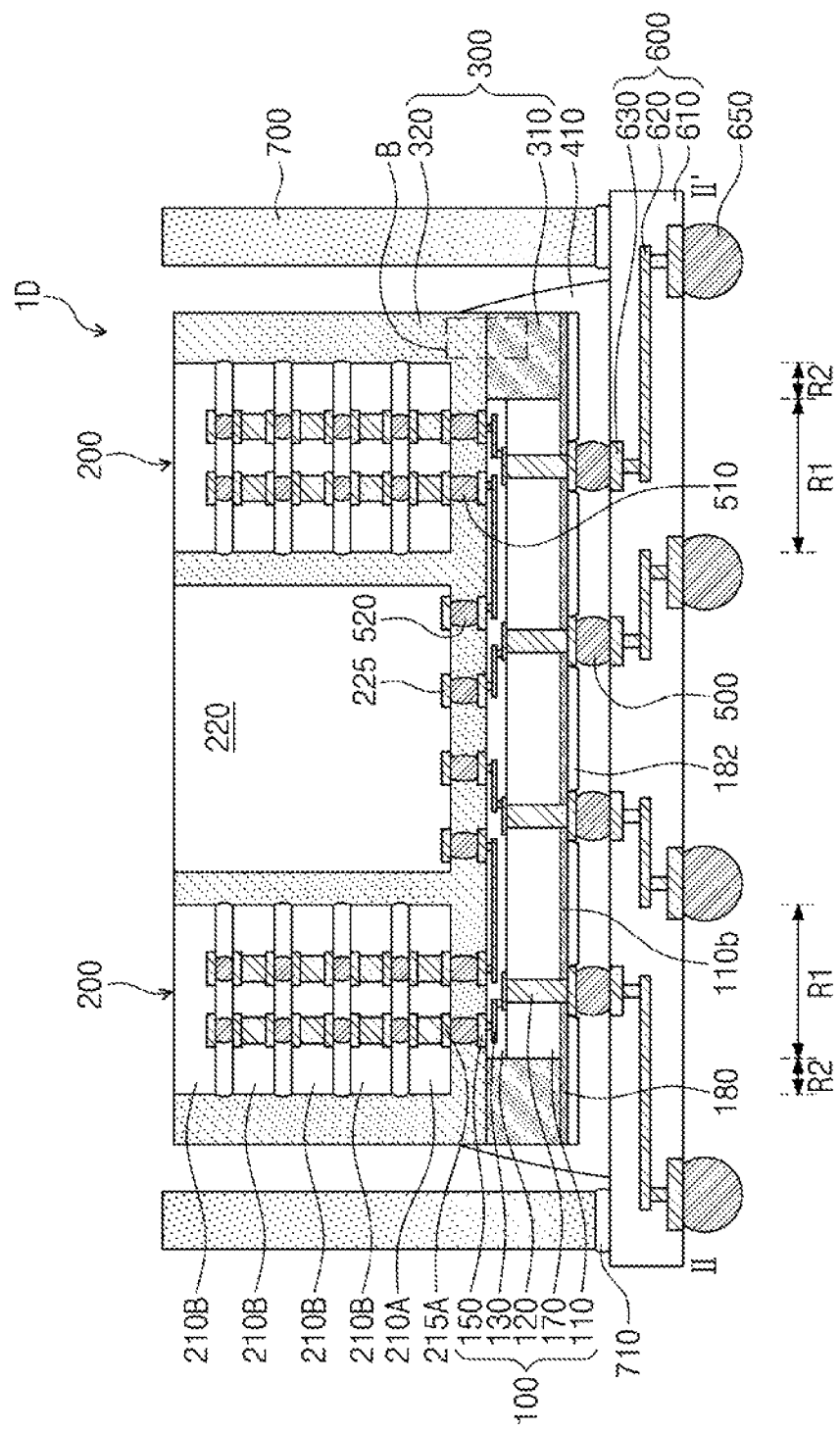
FIG. 4A is a cross-sectional view showing a semiconductor package according to embodiments of the present disclosure.
Figure 4B:
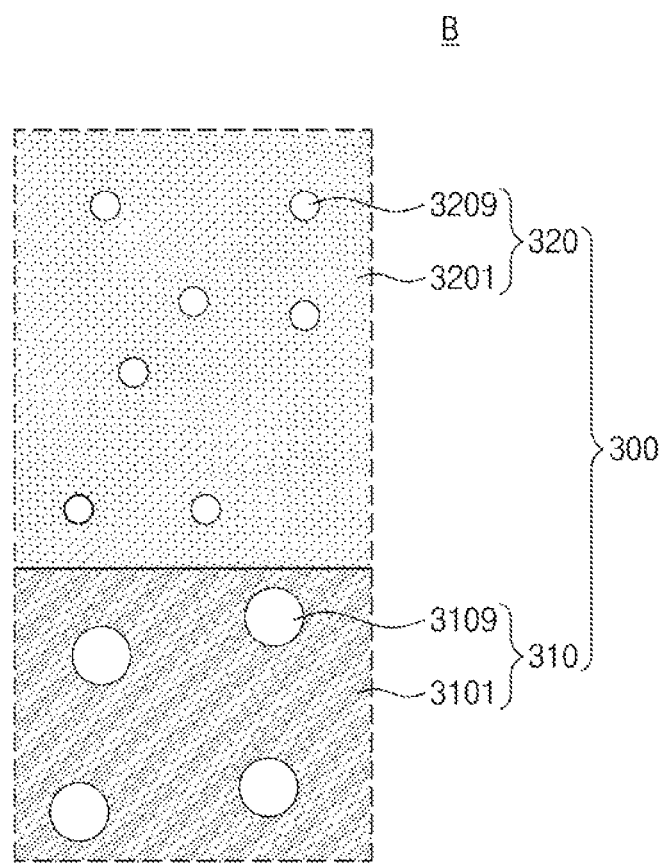
FIG. 4B is an enlarged view showing section B of FIG. 4A.

FIG. 4A is a cross-sectional view taken along line II-IF of FIG. 2A, showing a semiconductor package according to some embodiments of the present disclosure. FIG. 4B is an enlarged view showing section B of FIG. 4A.

Referring to FIGS. 4A and 4B, a semiconductor package may include a first package 1D, solder terminals 650, a package substrate 600, a lower under-fill layer 410, a stiffener 700, and an adhesive layer 710. The first package 1D may be substantially the same as the first package 1 discussed in FIGS. 1A and 1B. For example, the molding layer 300 may include a first molding pattern 310 and a second molding pattern 320. The second molding pattern 320 may include a different material from that of the first molding pattern 310. As shown in FIG. 4B, the first molding pattern 310 may include, for example, a first dielectric polymer 3101 and first fillers 3109. The first fillers 3109 may be dispersed in the first dielectric polymer 3101. The first fillers 3109 may include an inorganic material such as silica. The second molding pattern 320 may include a second dielectric polymer 3201 and second fillers 3209. The second fillers 3209 may be disposed in the second dielectric polymer 3201. The second fillers 3209 may include an inorganic material such as silica. The second fillers 3209 may have diameters that are less than those of the first fillers 3109.

The first package 1C might not include an under-fill layer (see 400 of FIGS. 1A and 1B). In this case, the second molding pattern 320 may further extend between the interposer substrate 100 and the first lower semiconductor chip 210A and between the interposer substrate 100 and the second semiconductor chip 220, thereby encapsulating the first bumps 510 and the second bumps 520.

FIGS. 5A to 5K are cross-sectional views showing a method of fabricating a semiconductor package according to some embodiments of the present disclosure. To the extent that a description of various elements has been omitted, it may be assumed that these elements are at least similar to corresponding elements that have been described elsewhere in the specification. For convenience of description, in explaining FIGS. 5F to 5K, top and bottom surfaces of a certain component will be discussed based on a figure that illustrates the certain component.

Figure 5A:
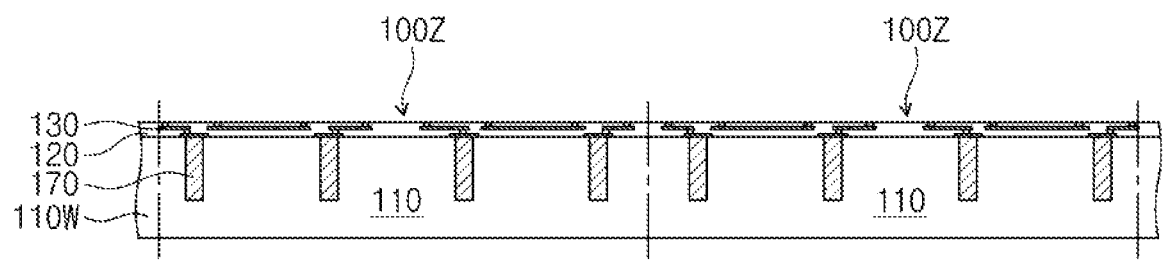
FIGS. 5A to 5K are cross-sectional views showing a method of fabricating a semiconductor package according to embodiments of the present disclosure.

Referring to FIG. 5A, preliminary interposer substrates 100Z may be fabricated. According to some embodiments of the present disclosure, a semiconductor wafer 110W may be prepared. The semiconductor wafer 110W may include a plurality of semiconductor dies 110. The semiconductor dies 110 may be connected to each other. The semiconductor dies 110 may be defined by a scribe lane defined on one surface of the semiconductor wafer 110W, but the present inventive concepts are not necessarily limited thereto.

Through vias 170 may be formed in the semiconductor wafer 110W. The through vias 170 may penetrate top surfaces of the semiconductor dies 110, but might not penetrate bottom surfaces of the semiconductor dies 110. The through vias 170 may have their bottom surfaces disposed in the semiconductor dies 110.

A wiring layer may be formed on a top surface of the semiconductor wafer 110W. The formation of the wiring layer may include forming a dielectric layer 120 and forming wiring structures 130. The wiring structures 130 may be coupled to the through vias 170. The preliminary interposer substrates 100Z may thus be fabricated. Each of the preliminary interposer substrates 100Z may include the semiconductor die 110, the through vias 170, the dielectric layer 120, and the wiring structures 130. The semiconductor wafer 110W and the dielectric layer 120 may undergo a first sawing process along dotted lines to separate the preliminary interposer substrates 100Z from each other.

Figure 5B:
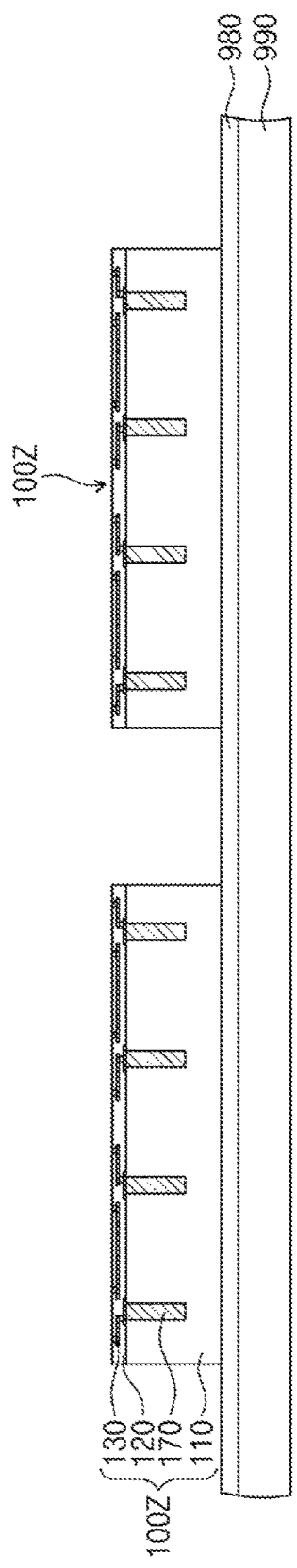

Referring to FIG. 5B, the separated preliminary interposer substrates 100Z may be located on a carrier substrate 990. In this case, the preliminary interposer substrates 100Z may be laterally spaced apart from each other. A release layer 980 may further be provided between the carrier substrate 990 and the preliminary interposer substrates 100Z. The release layer 980 may attach the preliminary interposer substrates 100Z to the carrier substrate 990.

Figure 5C:
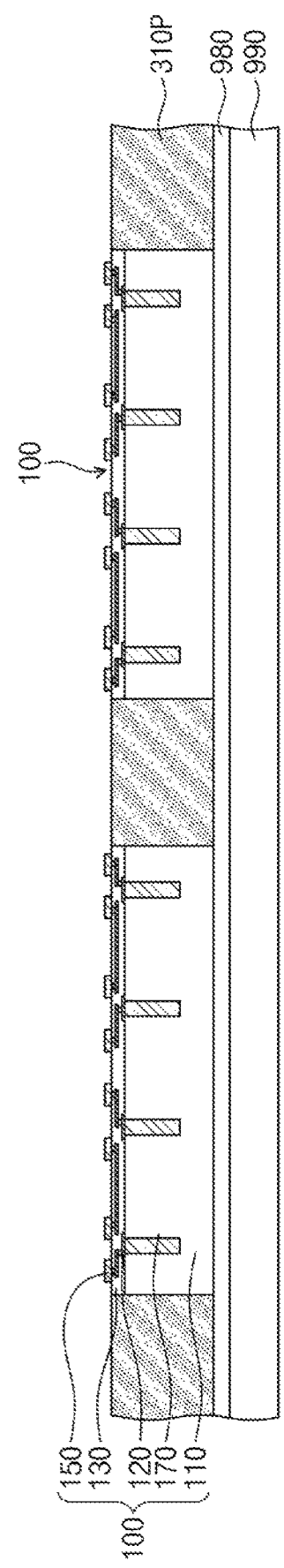

Referring to FIG. 5C, a first molding layer 310P may be formed on the carrier substrate 990, and may cover sidewalls of the preliminary interposer substrates 100Z. A wafer level process may be performed to form the first molding layer 310P. According to some embodiments of the present disclosure, the first molding layer 310P may be formed on a sidewall of the semiconductor die 110 and a top surface of the dielectric layer 120. Afterwards, the first molding layer 310P may be removed from the top surface of the dielectric layer 120 to thereby expose top surfaces of the wiring structures 130. For example, the first molding layer 310P might not remain on the top surface of the dielectric layer 120. The first molding layer 310P may have a top surface at substantially the same level as that of the top surface of the dielectric layer 120, but the present inventive concepts are not necessarily limited thereto. Alternatively, the first molding layer 310P may partially remain on the top surface of the dielectric layer 120.

Interposer pads 150 may correspondingly formed on the exposed top surfaces of the wiring structures 130, and may be coupled to the wiring structures 130. Therefore, interposer substrates 100 may be fabricated. Each of the interposer substrates 100 may include the semiconductor die 110, the through vias 170, the dielectric layer 120, the wiring structures 130, and the interposer pads 150. The following will describe a single interposer substrate 100, but the fabrication of a semiconductor package according to the present inventive concepts is not necessarily limited to chip-level fabrication processes.

Figure 5D:
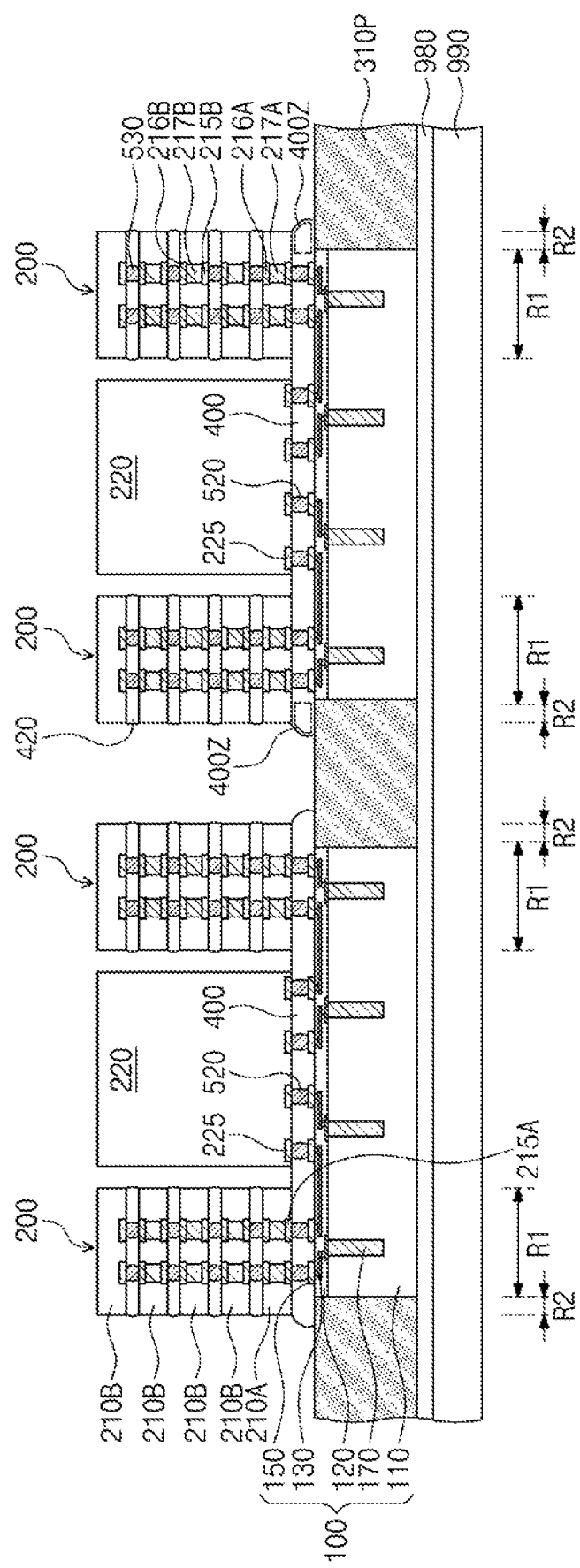

Referring to FIG. 5D, chip stacks 200 and a second semiconductor chip 220 may be mounted on the interposer substrate 100. As discussed above, each of the chip stacks 200 may include a first lower semiconductor chip 210A, a first upper semiconductor chip 210B, upper bumps 530, and under-fill patterns 420. The mounting of each of the chip stacks 200 may include locating the chip stack 200 on the interposer substrate 100 and the first molding layer 310P, and forming first bumps 510. In this case, the first lower semiconductor chip 210A may have a mount region R1 that vertically overlaps the interposer substrate 100, and may also have an overhang region R2 that vertically overlaps the first molding layer 310P. The first bumps 510 may be formed between the interposer substrate 100 and the mount region R1 of the first lower semiconductor chip 210A. The mounting of the second semiconductor chip 220 may include forming second bumps 520 between the second semiconductor chip 220 and the interposer substrate 100.

An under-fill layer 400 may be formed in a first gap between the interposer substrate 100 and the first lower semiconductor chip 210A and between the interposer substrate 100 and the chip stacks 200. The under-fill layer 400 may encapsulate the first bumps 510 and the second bumps 520. The under-fill layer 400 may extend between the top surface of the first molding layer 310P and a bottom surface at the overhang region R2 of the first lower semiconductor chip 210A. The under-fill layer 400 may have a distal end 400Z that is disposed on the first molding layer 310P and vertically overlaps the first molding layer 310P.

Figure 5E:
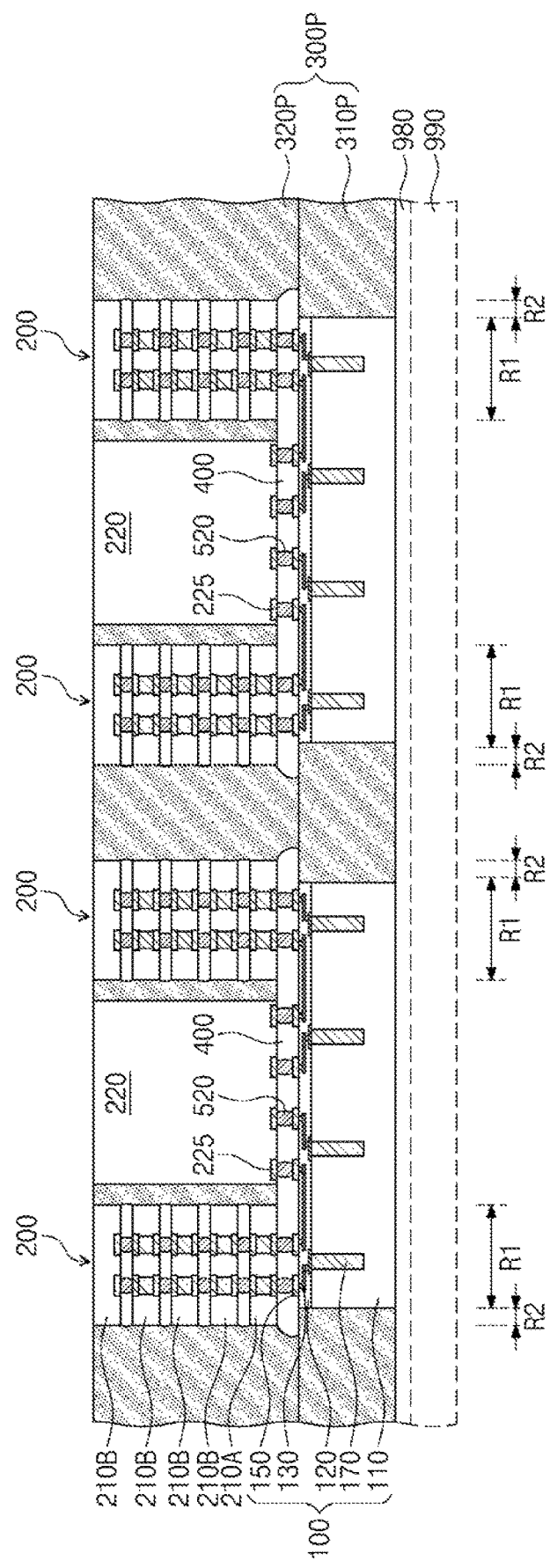

Referring to FIG. 5E, a second molding layer 320P may be formed on the first molding layer 310P and the interposer substrate 100, and thus a preliminary molding layer 300P may be formed. The second molding layer 320P may be formed by using a material the same as or similar to that of the first molding layer 310P. A wafer level process may be performed to form the second molding layer 320P. For example, the second molding layer 320P may cover sidewalls of a plurality of second semiconductor chips 220, sidewalls of a plurality of chip stacks 200, and a plurality of under-fill layers 400. The second molding layer 320P may further cover top surfaces of the second semiconductor chips 220 and top surfaces of the chip stacks 200. In this case, the second molding layer 320P may undergo a grinding process to remove a portion of the second molding layer 320P. The grinding process may continue until the top surfaces of the second semiconductor chips 220 are exposed and the top surfaces of the chip stacks 200 are exposed. For convenience, the following will describe a single second semiconductor chip 220.

The carrier substrate 990 and the release layer 980 may be removed as shown by dotted lines, and accordingly it may be possible to expose a bottom surface of the interposer substrate 100 and a top surface of the first molding layer 310P. The removal of the carrier substrate 990 and the release layer 980 may be preceded by the formation of the second molding layer 320P.

Figure 5F:
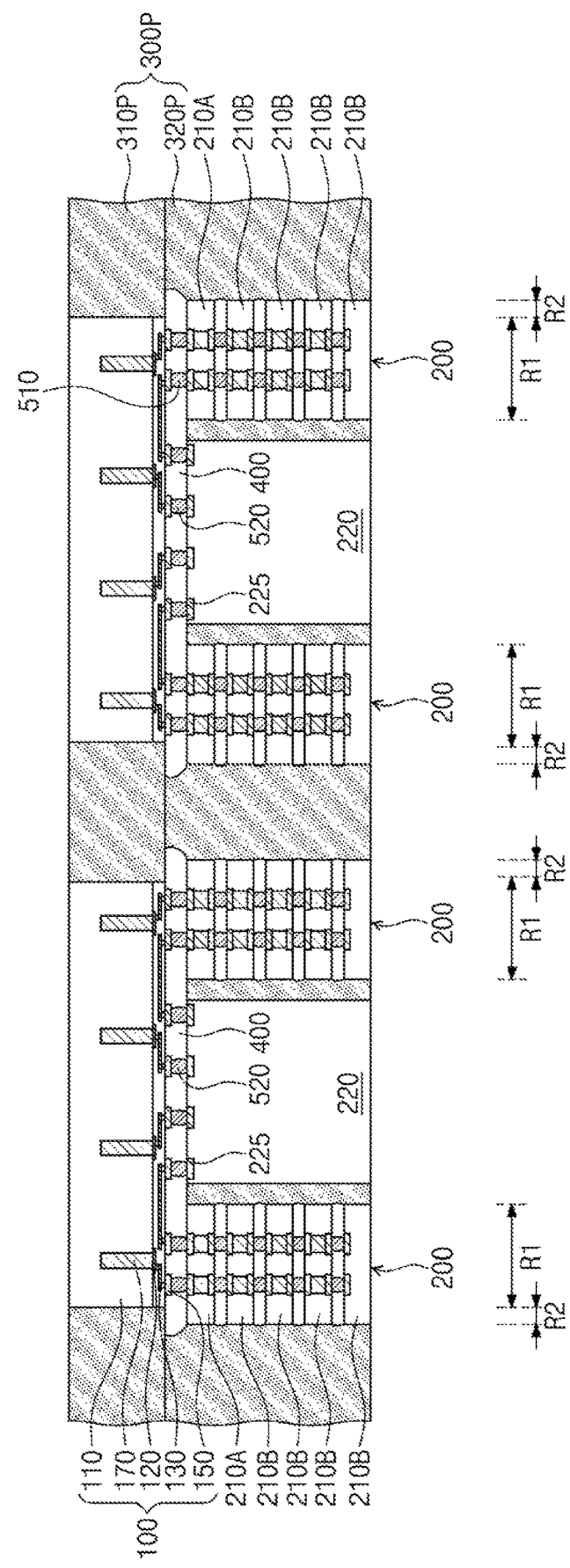

Referring to FIG. 5F, the interposer substrate 100, the preliminary molding layer 300P, the under-fill layer 400, the second semiconductor chip 220, and the chip stacks 200 may each be turned upside down to allow the interposer substrate 100 to face upwards.

Figure 5G:
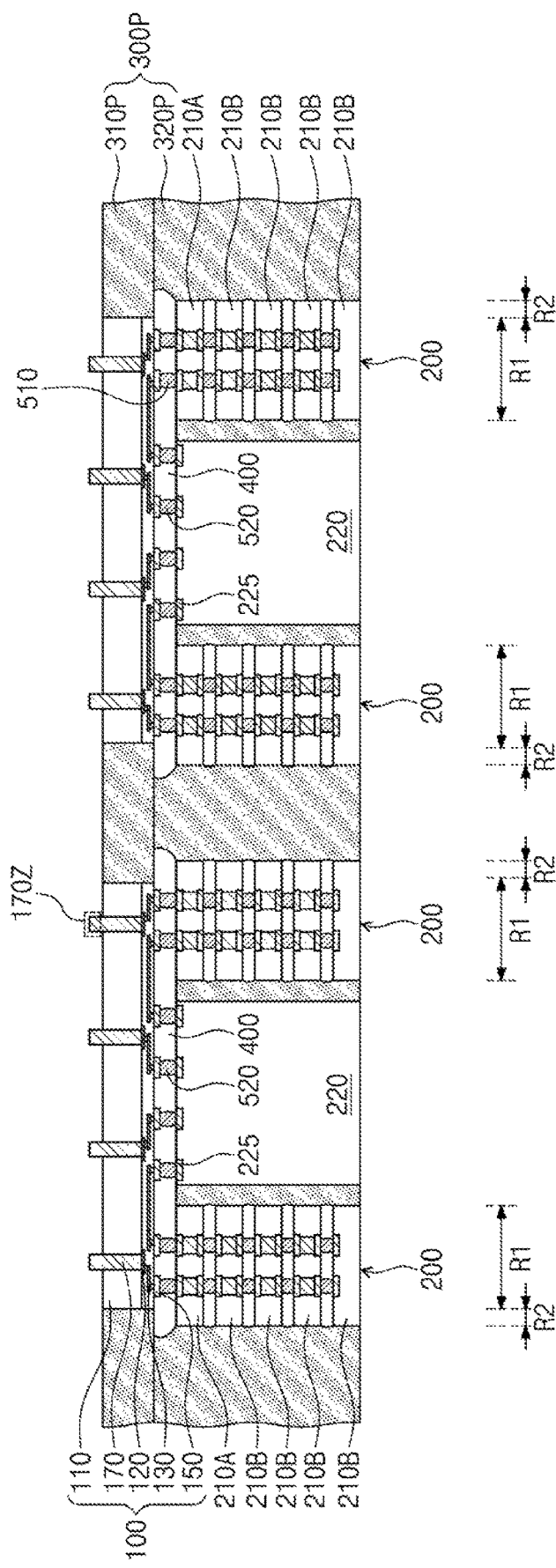

Referring to FIG. 5G, a thinning process may be performed on the semiconductor die 110 and the first molding layer 310P. The thinning process may include a grinding process or an etch-back process. After the thinning process is terminated, the top surface of the semiconductor die 110 may be located at substantially the same level as that of the top surface of the first molding layer 310P. The thinning process may allow the through vias 170 to have protrusions 170Z. The protrusions 170Z of the through vias 170 may be located at a higher level than that of the top surface of the thinned semiconductor die 110.

Figure 5H:
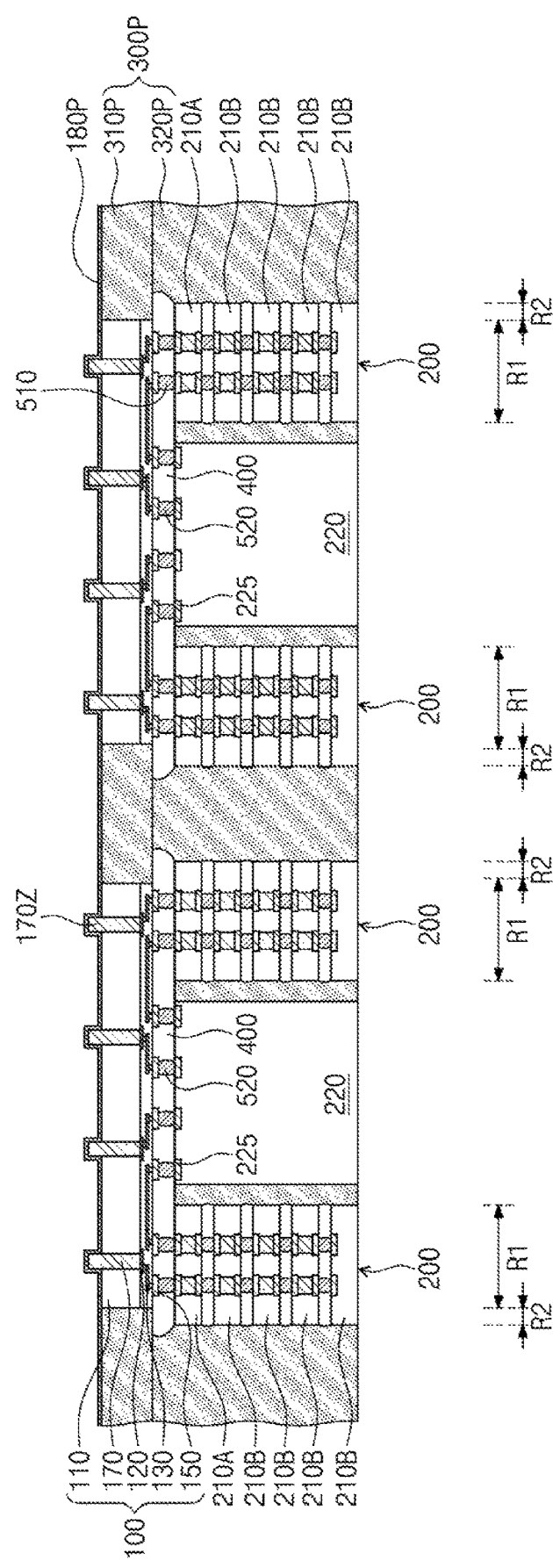

Referring to FIG. 5H, a first passivation layer 180P may be formed on the first molding layer 310P and the semiconductor die 110. The first passivation layer 180P may cover the top surface of the first molding layer 310P, the top surface of the semiconductor die 110, and the protrusions 170Z of the through vias 170. A deposition process may be performed to form the first passivation layer 180P. The deposition process may be a wafer-level deposition process.

Figure 5I:
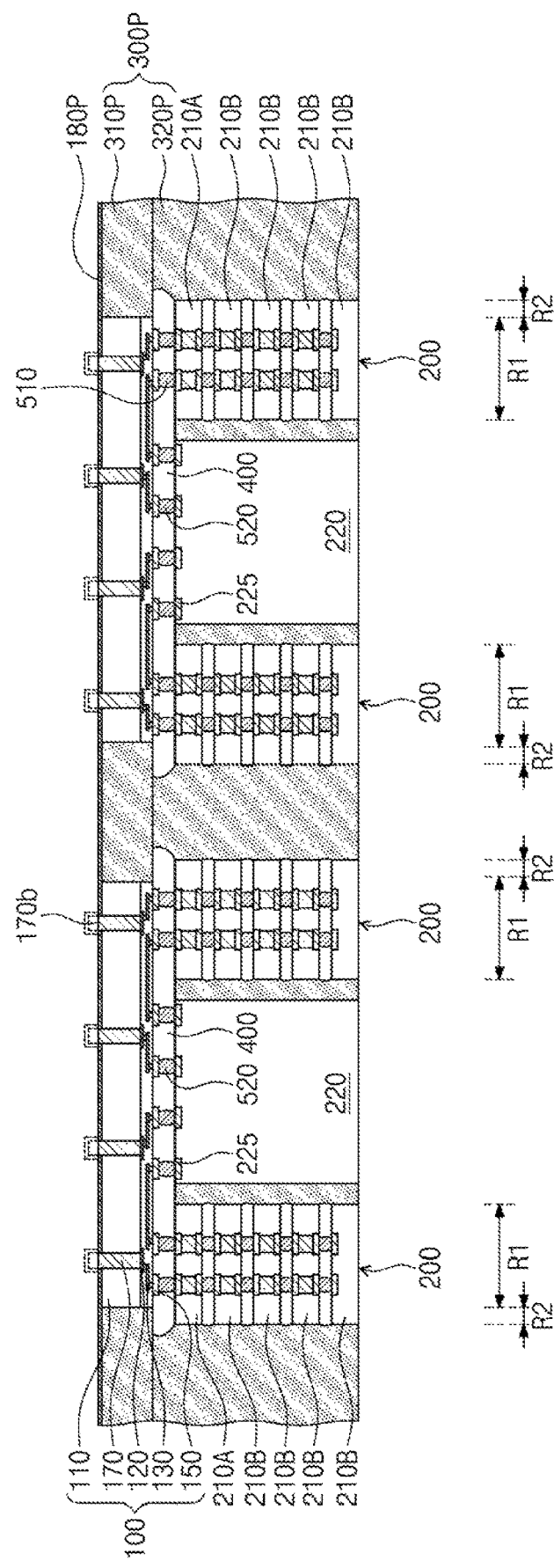

Referring to FIG. 5I, a polishing process may be performed on the first passivation layer 180P. As illustrated by dotted lines, the polishing process may remove a portion of the first passivation layer 180P and the protrusions 170Z of the through vias 170. The portion of the first passivation layer 180P may be segments that cover the protrusions 170Z of the through vias 170. As a result of the polishing process, surfaces 170b of the through vias 170 may be exposed. The surfaces 170b of the through vias 170 may be located at substantially the same level as that of a top surface of the first passivation layer 180P. The polishing process may include a chemical mechanical polishing process.

Figure 5J:
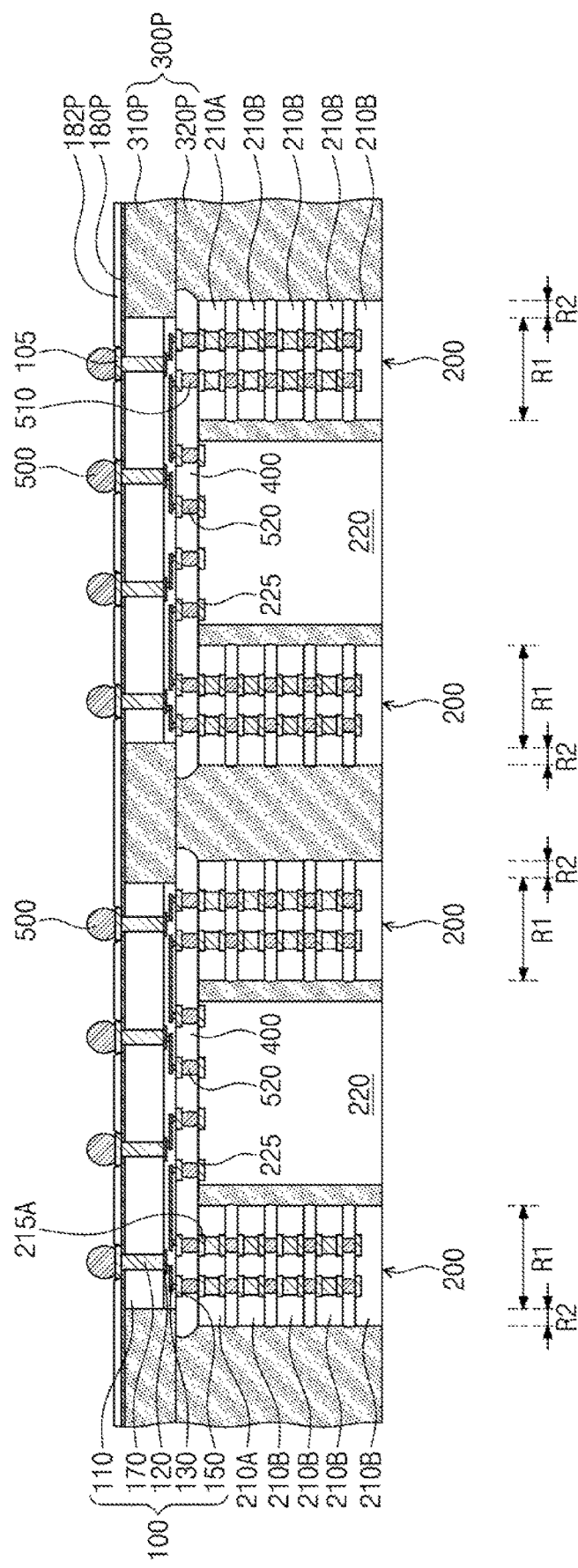

Referring to FIG. 5J, a second passivation layer 182P may be formed on and may cover the first passivation layer 180P. A coating process may be performed to form the second passivation layer 182P, but the present inventive concepts are not necessarily limited thereto. Openings may be formed in the second passivation layer 182P to expose the surfaces 170b of the through vias 170. Solder pads 105 may be formed on corresponding surfaces 170b of the through vias 170 to be coupled to corresponding through vias 170. Coupling solders 500 may be formed on corresponding solder pads 105.

Figure 5K:
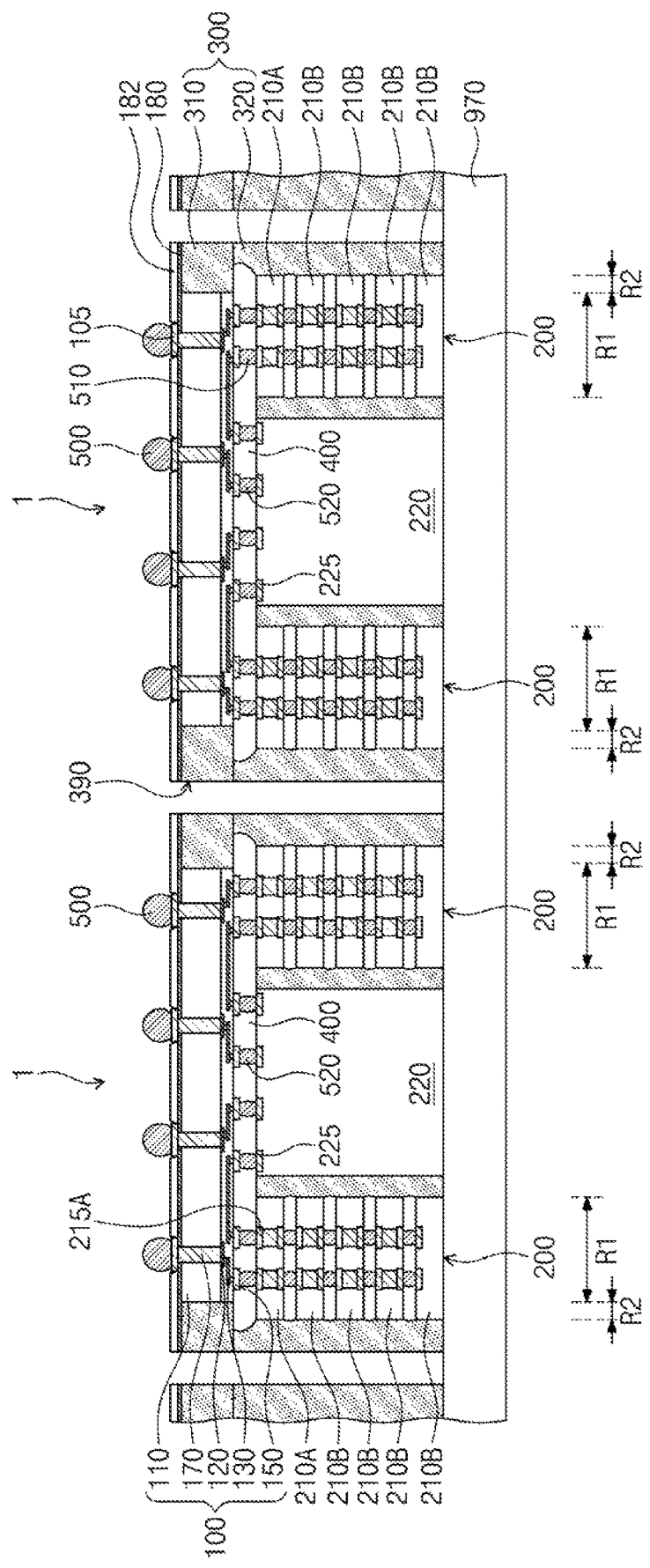

Referring sequentially to FIGS. 5J and 5K, a dicing tape 970 may be attached to bottom surfaces of the chip stacks 200, a bottom surface of the second semiconductor chip 220, and a bottom surface of the preliminary molding layer 300P.

Afterwards, the second passivation layer 182P, the first passivation layer 180P, and the preliminary molding layer 300P may undergo a second sawing process to form grooves 390. A blade may be used to perform the second sawing process. The grooves 390 may penetrate the second passivation layer 182P, the first passivation layer 180P, and the preliminary molding layer 300P, and thus the dicing tape 970 may be exposed. The second passivation layer 182P, the first passivation layer 180P, and the preliminary molding layer 300P may be diced to respectively form second passivation patterns 182, first passivation patterns 180, and molding layers 300. The grooves 390 may separate the molding layers 300 from each other. Each of the molding layers 300 may be at least partially surrounded by the groove 390. The grooves 390 may separate the first passivation patterns 180 from each other. The grooves 390 may separate the second passivation patterns 182 from each other. Therefore, first packages 1 may be fabricated. Each of the first packages 1 may be substantially the same as that discussed in the example of FIGS. 1A and 1B. A single first package 1 will be discussed below for brevity.

The under-fill layer 400 might not extend onto the bottom surface at the overhang region R2 of the first lower semiconductor chip 210A. This approach may be used to fabricate a first package 1A discussed in FIG. 2C. For example, when the second molding pattern 320 is formed of the same material as that of the first molding pattern 310, a first package 1C may be fabricated as discussed in FIG. 3.

Referring back to FIGS. 1A and 1B, the first package 1 may be separated from the dicing tape 970. After that, the first package 1 may be turned upside down to allow the coupling solders 500 to face downwards.

Referring again to FIGS. 2A and 2B, the first package 1 may be mounted on a central region of a package substrate 600. The mounting of the first package 1 may include coupling the coupling solders 500 to corresponding substrate pads 630.

Thereafter, a lower under-fill layer 410 may be formed between the package substrate 600 and the second passivation pattern 182. The lower under-fill layer 410 may further cover outer walls of the first and second passivation patterns 180 and 182 and outer walls of the first molding pattern 310.

A stiffener 700 may be located on a top surface at an edge region of the package substrate 600. An adhesive layer 710 may be formed between the package substrate 600 and the stiffener 700. A paste may be used to form the adhesive layer 710. The processes mentioned above may be used to fabricate a semiconductor package.

The examples of FIGS. 2A and 2B, of FIG. 2C, of FIG. 2D, of FIG. 3, and of FIGS. 4A and 4B may be combined with each other. For example, a thermal radiator 790 discussed in the example in connection with FIG. 2D may be included in the first package 1B of FIG. 2C, the first package 1C of FIG. 3, and/or the first package 1D of FIGS. 4A and 4B.

According to embodiments of the present disclosure, a width or length of an interposer substrate may be reduced to decrease a stress applied to the interposer substrate. A molding layer may be prevented from delaminating from the interposer substrate. In addition, the interposer substrate may have an increased active area fraction. The interposer substrate may be easily fabricated.

The molding layer may be disposed on a bottom surface at an overhang region of a first lower semiconductor chip, thereby covering sidewalls of the interposer substrate.

Because the molding layer has an increased volume, a difference in coefficient of thermal expansion between the interposer substrate and a package substrate may be counterbalanced by a difference in coefficient of thermal expansion between the molding layer and the interposer substrate. Therefore, warpage of a semiconductor package may be reduced. The semiconductor package may increase in operating reliability.

This detailed description of the present inventive concepts should not be construed as limited to the embodiments set forth herein, and it is intended that the present inventive concepts cover the various combinations, the modifications and variations of this invention without departing from the spirit and scope of the present disclosure.

What is claimed is:

1. A semiconductor package, comprising:
    a first semiconductor chip including a mount region and an overhang region;
    a substrate disposed on a bottom surface at the mount region of the first semiconductor chip;
    a passivation pattern disposed on a bottom surface of the substrate; and
    a molding layer disposed on the substrate,
    wherein the molding layer includes:
        a first molding pattern disposed on a bottom surface at the overhang region of the first semiconductor chip and at least partially covering a sidewall of the substrate; and
        a second molding pattern disposed directly on the first molding pattern and at least partially covering a sidewall of the first semiconductor chip, and
    wherein the passivation pattern extends onto a bottom surface of the first molding pattern.

2. The semiconductor package of claim 1, wherein a bottom surface of the first molding pattern is coplanar with a bottom surface of the substrate.

3. The semiconductor package of claim 1, further comprising an under-fill layer disposed between the substrate and the first semiconductor chip,
    wherein the under-fill layer is further disposed between the first molding pattern and the first semiconductor chip.

4. The semiconductor package of claim 1, further comprising a plurality of upper semiconductor chips stacked on the first semiconductor chip,
    wherein the first semiconductor chip includes a plurality of through vias defined therein, and
    wherein bottom surfaces of the through vias are at a level substantially the same as a level of a bottom surface of the passivation pattern.

5. The semiconductor package of claim 1, wherein
    the first molding pattern includes a first dielectric polymer and a plurality of first fillers,
    the second molding pattern includes a second dielectric polymer and a plurality of second fillers, and
    diameters of each of the second fillers are less than diameters of each of the first fillers.

6. The semiconductor package of claim 1, further comprising a second semiconductor chip disposed on a top surface of the substrate and located side by side with the first semiconductor chip,
    wherein, the second semiconductor chip at least partially overlaps the substrate.

7. The semiconductor package of claim 6, wherein
    the first semiconductor chip includes a plurality of pads disposed on a bottom surface of the first semiconductor chip, and the number of a plurality of chip pads of the second semiconductor chip is equal to or greater than twice the number of the pads of the first semiconductor chip.

8. The semiconductor package of claim 6, further comprising:
    a plurality of first bumps disposed between the substrate and the first semiconductor chip;
    a plurality of second bumps disposed between the substrate and the second semiconductor chip; and
    an under-fill layer disposed between the substrate and the second semiconductor chip,
    wherein the under-fill layer extends onto the substrate and the bottom surface at the mount region of the first semiconductor chip, and at least partially covers the first bumps and the second bumps.

9. The semiconductor package of claim 1, wherein the substrate includes a semiconductor die,
    wherein a coefficient of thermal expansion of the first molding pattern is greater than a coefficient of thermal expansion of the semiconductor die.

10. A semiconductor package, comprising:
    an interposer substrate;
    a first semiconductor chip disposed on top of the interposer substrate;
    a molding layer covering a sidewall of the interposer substrate;
    a package substrate disposed on the bottom surface of the interposer substrate; and
    a plurality of coupling solder elements disposed between the package substrate and the interposer substrate,
    wherein, the first semiconductor chip includes an overhang region and a mount region,
    wherein the molding layer is disposed on a bottom surface at the overhang region of the first semiconductor chip,
    wherein a bottom surface of the molding layer is coplanar with a bottom surface of the interposer substrate,
    wherein the interposer substrate includes a semiconductor die,
    wherein a coefficient of thermal expansion of the package substrate is greater than a coefficient of thermal expansion of the semiconductor die, and
    wherein a coefficient of thermal expansion of the molding layer is greater than the coefficient of thermal expansion of the semiconductor die.

11. The semiconductor package of claim 10, further comprising an under-fill layer disposed between the interposer substrate and the first semiconductor chip,
    wherein, an end of the under-fill layer is spaced apart from the interposer substrate.

12. The semiconductor package of claim 11, further comprising:
    an upper semiconductor chip disposed on the first semiconductor chip; and
    a second semiconductor chip disposed on the interposer substrate and located at a side of the first semiconductor chip,
    wherein the under-fill layer extends between the interposer substrate and the second semiconductor chip.

13. The semiconductor package of claim 10, further comprising a lower under-fill layer disposed between the package substrate and the interposer substrate,
    wherein a coefficient of thermal expansion of the lower under-fill layer is greater than the coefficient of thermal expansion of the semiconductor die.

14. A semiconductor package, comprising:
    an interposer substrate;

a plurality of solder terminals disposed on a bottom surface of the interposer substrate;

a chip stack disposed on a top surface of the interposer substrate, the chip stack including a first lower semiconductor chip and a plurality of first upper semiconductor chips disposed on the first lower semiconductor chip;

a plurality of first bumps disposed between the interposer substrate and the first lower semiconductor chip; and a molding layer disposed on the interposer substrate, wherein the first lower semiconductor chip includes a plurality of through electrodes disposed therethrough, wherein the interposer substrate includes a semiconductor die, a plurality of through vias, a plurality of wiring structures, and a plurality of interposer pads, wherein, the first lower semiconductor chip includes:
a mount region disposed on the interposer substrate; and
an overhang region spaced apart from the interposer substrate, wherein the molding layer includes:
a first molding pattern disposed on a bottom surface at the overhang region of the first lower semiconductor chip and covering a sidewall of the interposer substrate; and
a second molding pattern disposed on the first molding pattern and covering a sidewall of the first lower semiconductor chip and sidewalls of the first upper semiconductor chips, and wherein a coefficient of thermal expansion of the first molding pattern is greater than a coefficient of thermal expansion of the semiconductor die.

15. The semiconductor package of claim 14, further comprising:
a second semiconductor chip disposed on the top surface of the interposer substrate;
a plurality of second bumps disposed between the interposer substrate and the second semiconductor chip; and
an under-fill layer disposed between the interposer substrate and the first lower semiconductor chip and further disposed between the interposer substrate and the second semiconductor chip, wherein the chip stack includes a first chip stack and a second chip stack that are spaced apart from each other, wherein, the second semiconductor chip is disposed between the first chip stack and the second chip stack, and wherein the under-fill layer extends between a top surface of the first molding pattern and the bottom surface at the overhang region of the first lower semiconductor chip.

16. The semiconductor package of claim 14, further comprising:
a first passivation pattern covering the bottom surface of the interposer substrate and a bottom surface of the first molding pattern; and
a second passivation pattern disposed on a bottom surface of the first passivation pattern, wherein the second passivation pattern includes a material different from a material of the first passivation pattern.

17. The semiconductor package of claim 14, further comprising:
a package substrate disposed on the bottom surface of the interposer substrate;
a plurality of coupling solder elements disposed between the package substrate and the interposer substrate;
a lower under-fill layer disposed between the package substrate and the interposer substrate and covering sidewalls of the solder terminals; and
a stiffener disposed on an edge region of the package substrate and laterally spaced apart from the molding layer.

18. The semiconductor package of claim 14, wherein a bottom surface of the first molding pattern is at a level substantially the same as a level of a bottom surface of the semiconductor die.

* * * * *